(12) United States Patent
Liang

(10) Patent No.: US 11,271,480 B2
(45) Date of Patent: Mar. 8, 2022

(54) DRIVING CIRCUIT WITH ENERGY RECYCLE CAPABILITY AND METHOD THEREOF

(71) Applicant: xMEMS Labs, Inc., Santa Clara, CA (US)

(72) Inventor: Jemm Yue Liang, Sunnyvale, CA (US)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 17/380,027

(22) Filed: Jul. 20, 2021

(65) Prior Publication Data

US 2022/0037997 A1 Feb. 3, 2022

Related U.S. Application Data

(60) Provisional application No. 63/078,741, filed on Sep. 15, 2020, provisional application No. 63/066,119, (Continued)

(51) Int. Cl.
| | |
|---|---|
| *H02M 3/158* | (2006.01) |
| *H02M 3/157* | (2006.01) |
| *H04R 17/00* | (2006.01) |
| *H02M 1/08* | (2006.01) |
| *H02M 1/00* | (2006.01) |

(52) U.S. Cl.
CPC ............ *H02M 3/157* (2013.01); *H02M 1/08* (2013.01); *H02M 3/158* (2013.01); *H04R 17/00* (2013.01); *H02M 1/0003* (2021.05)

(58) Field of Classification Search
CPC ............ H02M 1/0003; H02M 1/0006; H02M 1/0032; H02M 3/08; H02M 3/156; H02M 3/157; H02M 3/158; H04R 17/00; H04R 17/10
See application file for complete search history.

(56) References Cited

U.S. PATENT DOCUMENTS

| | | | | |
|---|---|---|---|---|
| 5,416,387 A | * | 5/1995 | Cuk ..................... | H05B 41/28 315/209 R |
| 5,982,317 A | | 11/1999 | Steensgaard-Madsen | |

(Continued)

OTHER PUBLICATIONS

Liang, the specification, including the claims, and drawings in the U.S. Appl. No. 17/380,034, filed Jul. 20, 2021.

*Primary Examiner* — Matthew V Nguyen
(74) *Attorney, Agent, or Firm* — Winston Hsu

(57) ABSTRACT

A method, applied in a driving circuit including a bidirectional circuit coupled between a voltage source and a load, includes receiving a feedback signal from the load and an input signal; generating a plurality of pulse width modulation (PWM) signals according to the input signal and the feedback signal; driving the load by the bidirectional circuit according to the plurality of PWM signals such that the input signal and the feedback signal are substantially proportional to each other. The input signal is a time varying signal. The step of generating a PWM signal among the plurality of PWM signals according to the input signal and the feedback signal includes determining a difference according to the input signal and the feedback signal; and generating the PWM signal with a pulse width. The pulse width is determined according to the difference.

30 Claims, 11 Drawing Sheets

Related U.S. Application Data filed on Aug. 14, 2020, provisional application No. 63/063,283, filed on Aug. 8, 2020, provisional application No. 63/061,184, filed on Aug. 5, 2020, provisional application No. 63/060,517, filed on Aug. 3, 2020.

(56) References Cited

U.S. PATENT DOCUMENTS

| | | | |
|---|---|---|---|
| 6,573,850 B1 | 6/2003 | Pennock | |
| 7,109,608 B2 * | 9/2006 | Yao | G05B 11/42 307/112 |
| 7,199,740 B1 | 4/2007 | Ferguson, Jr | |
| 7,696,911 B2 | 4/2010 | Tsuchi | |
| 8,064,158 B1 * | 11/2011 | Carter | G05B 11/01 360/78.12 |
| 8,384,577 B1 | 2/2013 | Landt | |
| 8,970,639 B2 | 3/2015 | Tu | |
| 2004/0070528 A1 | 4/2004 | Keehr | |
| 2004/0140922 A1 | 7/2004 | Melanson | |
| 2004/0141558 A1 | 7/2004 | Plisch | |
| 2005/0122245 A1 | 6/2005 | Frith | |
| 2007/0035434 A1 | 2/2007 | Tachibana | |
| 2007/0109164 A1 | 5/2007 | Arias | |
| 2008/0136696 A1 | 6/2008 | Walton | |
| 2010/0052957 A1 | 3/2010 | Craninckx | |
| 2010/0245142 A1 | 9/2010 | Myles | |
| 2012/0104989 A1 * | 5/2012 | Wu | H02J 7/34 320/101 |
| 2014/0184434 A1 | 7/2014 | Chen | |
| 2014/0285370 A1 | 9/2014 | Miki | |
| 2019/0280704 A1 | 9/2019 | Bodnar | |

* cited by examiner

DRIVING CIRCUIT WITH ENERGY RECYCLE CAPABILITY AND METHOD THEREOF

CROSS REFERENCE TO RELATED APPLICATIONS

This application claims the benefits of U.S. Provisional Application No. 63/060,517, filed on Aug. 3, 2020 and entitled "Amplifier Control Method and Apparatus", U.S. Provisional Application No. 63/061,184, filed on Aug. 5, 2020 and entitled "Amplifier Control Method and Apparatus", U.S. Provisional Application No. 63/063,283, filed on Aug. 8, 2020 and entitled "Amplifier Control Methods & Apparatus", U.S. Provisional Application No. 63/066,119, filed on Aug. 14, 2020 and entitled "Amplifier Control Method & Apparatus", U.S. Provisional Application No. 63/078,741, filed on Sep. 15, 2020 and entitled "Amplifier Control Methods & Apparatus", which are incorporated herein by reference.

BACKGROUND OF THE INVENTION

1. Field of the Invention

The present application relates to a method and a driving circuit, and more particularly, to a driving circuit capable of energy recycling and a method thereof.

2. Description of the Prior Art

Recently, piezoelectric-actuated speakers (piezo-speakers) have emerged. Due to the capacitive nature of thin film piezoelectric actuators, these piezo-speakers present highly capacitive loads to the amplifiers. However, conventional driving circuits, such as class-AB, -D, -G, -H amplifiers, have all evolved assuming the loading (coils made of very fine wires) will be mostly resistive and slightly inductive, these amplifiers are inefficient when driving the highly capacitive loads such as piezo-speakers.

In addition, due to the capacitive nature of the load, the current and driving voltage would be about 90° out of phase. As a result, piezo-speakers do not actually consume much of the power drawn from power source during the charging phase (or cycle) when the voltage across the speaker terminals increases. Instead, most of the energy drawn from power source during the charging phase is stored within the capacitance of the load. However, during the discharging phase (or cycle), when the voltage across the speaker terminals decreases, conventional class-AB, -D, -G or -H amplifiers will simply drain the energy from the capacitance of the load to the ground (or to the negative power supply), which is a waste of energy.

Therefore, it is necessary to improve the prior art.

SUMMARY OF THE INVENTION

It is therefore a primary objective of the present application to provide a driving circuit with energy recycle capability and a method thereof, to improve on the deficiency of the prior arts.

An embodiment of the present application discloses a method, applied in a driving circuit comprising a bidirectional circuit coupled between a voltage source and a load, the method comprising receiving a feedback signal from the load and an input signal; generating a plurality of pulse width modulation (PWM) signals according to the input signal and the feedback signal; driving the load by the bidirectional circuit according to the plurality of PWM signals, such that the input signal and the feedback signal are substantially proportional to each other, wherein the input signal is a time varying signal; wherein the step of generating a PWM signal among the plurality of PWM signals according to the input signal and the feedback signal comprises determining a difference according to the input signal and the feedback signal; and generating the PWM signal with a pulse width, wherein the pulse width is determined according to the difference.

An embodiment of the present application discloses a driving circuit, comprising a bidirectional circuit, coupled between a voltage source and a load and configured to drive the load according to a plurality of pulse width modulation (PWM) signals, such that the input signal and the feedback signal are substantially proportional to each other, wherein the input signal and the feedback signal are time varying signals; a PWM controller, coupled to the load and the bidirectional circuit, configured to receive a feedback signal from the load and an input signal and generate the plurality of PWM signals according to the input signal and the feedback signal; wherein the PWM controller determines a difference according to the input signal and the feedback signal, generates a PWM signal among the plurality of PWM signals with a pulse width, and the pulse width is determined according to the difference.

These and other objectives of the present application will no doubt become obvious to those of ordinary skill in the art after reading the following detailed description of the preferred embodiment that is illustrated in the various figures and drawings.

DETAILED DESCRIPTION

In the present application, the term "coupled to" may refer to direct or indirect connection. "Component A being coupled to component B" may indicate that component A is directly connected to component B or component A is connected to component B via some component C. In addition, the term "pulse width" in the context of charging pulse width look-up table and discharging pulse width look-up table may refer to a control code used to control the pulse width a pulse either through analog means with DAC, sawtooth waveform and analog comparator, or through digital means with counter, clock and digital comparator.

In the following description and in the claims, the term "substantially" generally means a small deviation may exist or not exist. For instance, the term "substantially the same" means that a deviation is within, e.g., 10% of a given value or range, or mean within 5%, 3%, 2%, 1%, or 0.5% of a given value or range. That is, two quantities a and b being substantially the same refers to $|a-b| \leq \varepsilon \times |a|$ or $|a-b| \leq \varepsilon \times |b|$, where $\varepsilon$ represent a small number which may be, e.g., $10^{-1}$, $10^{-2}$, $10^{-3}$ or less, and a outputs an absolute value or a magnitude of a. For instance, an output signal $V_L$ being substantially proportional to an input signal IN implies that, $\|IN(t)-c \cdot V_L(t)\|^2 \leq \varepsilon \cdot \|IN(t)\|^2$ is satisfied, where $\|s(t)\|^2$ may represents an energy of an arbitrary signal s(t), IN(t) and $V_L(t)$ represent time-varying function of the input signal and the output signal, respectively, c represents a constant which can be either positive or negative, and $\varepsilon$ represent a small number which may be, e.g., $10^{-1}$, $10^{-2}$, $10^{-3}$ or less.

Figure 12:
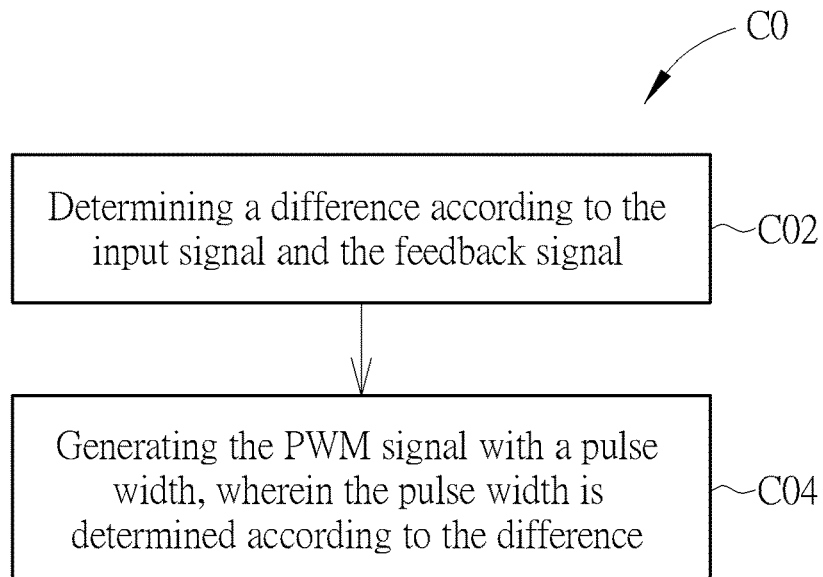

To recycle the energy stored in the capacitive load, Applicant provides a method of driving circuit with energy recycle capability in U.S. application Ser. No. 17/022,106, so as to utilize a DC-DC converter circuit to function as charging circuit to charge up the capacitive load; utilize another DC-DC converter circuit to function as discharging circuit to recycle the energy stored in the capacitive load; and utilize the PWM controller to compensate the imbalance of the charge transferring capability of the charging circuit and the discharging circuit. However, due to the use of analog (real-time) feedback loop, overshooting and close-loop stability can make it difficult to raise the open-loop gain, which is necessary to suppress the residual error in order to achieve good total harmonic distortion (THD) performance. Besides, the diametrically opposite trend of the charge transferring capability of the charging circuit and the discharging circuit relative to the output voltage level, as shown in FIG. 12 of U.S. application Ser. No. 17/022,106, cause grave compromises in the design of the analog PWM controller, resulting in subpar performance.

To address this issue, in the present application, an embodiment based on digital n-bit modulation is introduced, where the control loop is digitalized using an analog-to-digital converter (ADC) and the control loop is performed in digital domain, with a look-up table storing pre-calculated PWM pulse width control information (i.e. PWCC, pulse width control code); and a PWM pulse generator to convert digitally encoded PWM pulse width (i.e. PWCC) into actual PWM pulses. Furthermore, to address the issue of the diametrically opposed trend of the charge transferring capability of the charging circuit and the discharging circuit relative to the output voltage level, the control of the charging operation is decoupled from the discharging operation by having a PWCC table dedicated to the charging operation and another PWCC table dedicated to the discharging operation. (In practice, this separation is usually only conceptual, and these two PWCC tables may reside within one contiguous memory address space.)

In an embodiment, before each DC-DC switching cycle (or "switching cycle" for brief), the state of each switching cycle is determined to be charging, discharging, or idle according to a difference between a desired output signal (generally the input signal multiplied by a gain) and a feedback signal in digital domain. For non-idle switching cycles, the width of the PWM is controlled to produce a charge transfer such that, in each cycle, a unit voltage change (e.g. $\Delta V$) or an integral multiple of a unit voltage change (e.g. $\pm n \times \Delta V$) is produced according to look-up tables, wherein the charge transfer is compensated for factors such as the relationship between a supply/source voltage and a load voltage; the relationship between the amplitude of the current and circuit parameters such as resistivity, inductor core saturation, etc.; the direction of current flow (charging or discharging); and the relationship between the permittivity and the voltage of the load.

Figure 1:
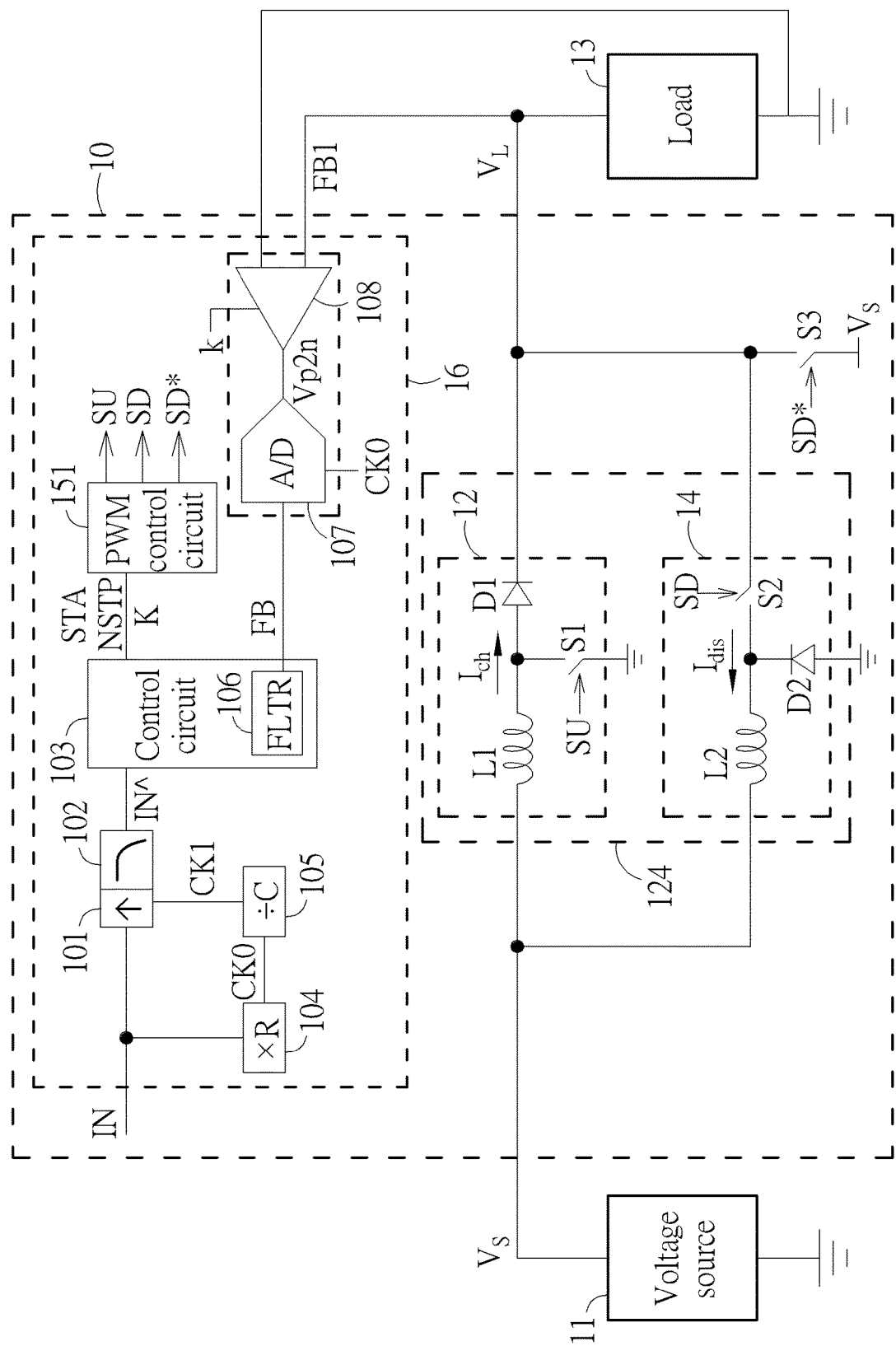
FIG. 1 is a schematic diagram of a driving circuit according to an embodiment of the present application.

Please refer to FIG. 1, which is a schematic diagram of a driving circuit 10 according to an embodiment of the present application. The driving circuit 10, coupled between a voltage source 11 and a load 13, receives an input signal IN to drive the load 13 according to the input signal IN. The input signal IN may be an input audio signal.

The voltage source 11 is a power source which may own energy storage capability. For example, the voltage source 11 may comprise a battery (which may or may not be a rechargeable battery) or a DC (direct current) power supply, e.g., a DC-DC switching power supply. In an embodiment, the voltage source 11 (e.g., the DC-DC switching power supply) may comprise a capacitor or have capacitance therein.

In an embodiment, the load 13 may comprise a speaker, or equivalently, a sound producing device or an acoustic transducer. In this case, the input signal IN may be an audio signal. In an embodiment, the speaker within the load 13 may comprise a piezoelectric actuated speaker. Specifically, the driving circuit 10 may be connected to a piezoelectric actuator of the piezoelectric actuated speaker. The piezoelectric actuator within the load 13 may comprise a piezoelectric layer sandwiched between a first/top electrode and a second/bottom electrode. Moreover, the driving circuit 10 may be connected to the electrodes of the actuator. Note that, significant capacitance exists between the first/top electrode and the second/bottom electrode, such that the load 13 may be referred to as a capacitive load, a speaker or a capacitive speaker load.

The driving circuit 10 is configured not only to form a charging current from the voltage source 11 to the load 13 during a charging phase, but also to form a discharging current from the load 13 back to the voltage source 11 during a discharging phase. In this regard, energy stored into the capacitance within the load 13 during the charging phase would be recycled back to the capacitance within (or along with) the voltage source 11 during the discharging phase, such that an overall consumed energy is reduced.

Specifically, the driving circuit 10 comprises a bidirectional circuit 124 comprising a charging circuit 12 and a discharging circuit 14, and a PWM (pulse width modulation) controller 16. The PWM controller 16 may be realized by, e.g., application specific integrated circuit (ASIC), which is not limited thereto. The charging circuit 12 and the discharging circuit 14 have a first terminal coupled to the voltage source 11 and a second terminal coupled to the load 13. The charging circuit 12 is configured to form a first/charging current $I_{ch}$ (or to provide a first/charging current path) from the voltage source 11 to the load 13; the discharging circuit 14 is configured to form a second/discharging current $I_{dis}$ (or to provide a second/discharging current path) from the load 13 back to the voltage source 11.

Along with the capacitance within the load 13, the charging circuit 12 forms a boost converter (a kind of DC-DC converter) from $V_L$ to $V_S$ during the charging phase, and the discharging circuit 14 forms a buck converter (another kind of DC-DC converter) from $V_S$ to $V_L$ during the discharge phase. In other words, it can be regarded that the driving circuit 10 utilizes the boost converter (charging circuit 12) to perform a charging operation on the capacitance within the load 13 and raise the voltage across the terminals of load 13, $V_L$, and utilizes the buck converter (discharging circuit 14) to perform a discharging operation on the capacitance within the load 13 to lower the voltage across the terminals of load 13, $V_L$.

In an embodiment, during the charging phase, a time interval corresponding to an upswing portion of the voltage $V_L$, the charging circuit 12 provides the charging current $I_{ch}$ from the voltage source 11 to the load 13 to perform the charging operation; during the discharging phase, a time interval corresponding to a downswing portion of the voltage $V_L$, the discharging circuit 14 directs the discharging current $I_{dis}$ to flow from the load 13 back to the voltage source 11 to perform the discharging operation.

In the embodiment shown in FIG. 1, the charging circuit 12 comprises a switch S1, a diode D1 and an inductor L1; the discharging circuit 14 comprises a switch S2, a diode D2 and an inductor L2. The switch S1 is controlled by a first PWM signal SU, and the switch S2 is controlled by a second PWM signal SD, where the PWM signals SU and SD are generated by the PWM controller 16. The PWM controller 16 has a first input terminal to receive the input signal IN and a second input terminal coupled to the load 13 to receive a feedback signal FB1. The PWM controller 16 generates the PWM signals SU and SD according to the input signal IN and the feedback signal FB1, such that the driving circuit 10 drives the load 13 according to the input signal IN. The diodes D1 and D2 act as rectifying component, which will be elaborated later.

Connections between components within the driving circuit 10 are detailed as follows. Within the charging circuit 12, an anode of the diode D1 is coupled to the voltage source 11 via the inductor L1, a cathode of the diode D1 is coupled to the load 13. A first terminal of the switch S1 is coupled to the anode of the diode D1. That is, a first terminal of the inductor L1 is coupled to the voltage source 11, and a second terminal of the inductor L1 is coupled to the anode of the diode D1 and the first terminal of the switch S1. In an embodiment, a second terminal of the switch S1 may be coupled to a ground terminal, as FIG. 1 illustrates, but not limited thereto. Within the discharging circuit 14, a first terminal of the switch S2 is coupled to the voltage source 11 via the inductor L2 and a second terminal of the second switch S2 is coupled to the load 13. A cathode of the diode D2 is coupled to the first terminal of the switch S2. That is, a first terminal of the inductor L2 is coupled to the voltage source 11, and a second terminal of the inductor L2 is coupled to the cathode of the diode D2 and the first terminal of the switch S2. In an embodiment, an anode of the diode D2 may be coupled to a ground terminal, as FIG. 1 illustrates, but not limited thereto.

In an embodiment, diodes D1, D2 may be replaced by Synchronous Rectifier (SR), comprising a switch/MOSFET with proper (gate) control signal, which will be elaborated later. In an embodiment, instead of dedicated inductors L1 and L2, these two inductors may be merged into one shared inductor. In an embodiment, instead of a dedicated circuit 12 (boost converter) for charging operation and a dedicated circuit 14 (buck converter) for discharging operation, both charging and discharging may be accomplished, with suitable driving signals, by one buck-boost converter circuit.

In an embodiment, the load 13 may be coupled to directly a ground terminal, as FIG. 1 illustrates. In an alternative embodiment, the load 13 may be coupled to a DC bias voltage source ($V_{BIAS}$), but not limited thereto.

The voltage source 11 provides a supply/source voltage $V_S$, and the load 13 has a load voltage $V_L$, where $V_L$ may also be regarded as an output voltage of the load 13. Although the embodiment is discussed under a context that the supply/source voltage $V_S$ is no higher than the load voltage $V_L$, i.e., $V_S \leq V_L$, the application of the concepts disclosed herein is not limited thereto.

Despite of the circuit topology being similar to the DC-DC switching power supply (e.g. the boost converter and/or the buck converter), the control mechanism of the switch S1/S2 is actually closer to which is used in conventional class D amplifier, where the switch S1/S2 is controlled by the PWM signal generated according to the input signal IN and the feedback signal FB1 and by the PWM controller. The PWM controller will be detailed later.

Different from driving circuit in the art, such as class-D or class-AB amplifiers, the discharging current $I_{dis}$ is diverted, by the discharging circuit 14, from the load 13 back toward the voltage source 11, instead of toward a ground terminal or another voltage source (e.g., a negative voltage source). It can be regarded that the energy/charge store in the capacitance within the load 13 is recycled and stored back to the voltage source 11. Therefore, the power consumption of the driving circuit is significantly reduced.

As shown in the PWM controller 16, the input signal IN, which may be the output of an ADC, or come in via a parallel or a serial bus such as S/PDIF, PDM or Integrated Interchip Sound (I2S) bus, is to be amplified by the driving circuit 10 and may be encoded in 16 bps or 24 bps Pulse-code modulation (PCM) format at a data rate of 44.1 Ksps, 48 Ksps, 96 Ksps or 192 Ksps. A phase-locked loop 104 may raise the clock of the input signal IN by R times to produce a clock signal CK0. A clock divider 105 may scale the clock signal CK0 down by C times to produce a clock signal CK1. The clock signal CK1 defines the "switching cycle" of the driving circuit 10, C is the number of clocks of the clock signal CK0 per switching cycle and the clock signal CK0 controls the operation of the driving circuit 10 within each switching cycle. For example, the input signal IN has a data rate of 48 Ksps and R=1024, C=16 then CK0=49.152 MHz, CK1=3.072 MHz. In another example, the input signal IN has a data rate of 48 Ksps and R=336, C=16 then CK0=16.128 MHz, CK1=1.008 MHz.

Under such a situation, an up-sampler 101 may perform a decimation operation and an interpolation operation on the input signal IN with the clock signal CK1 (i.e. an up-sampling rate). An up-sampler filter 102 may filter out or attenuate higher frequency components induced by the up-sampler 101, and may be a low-pass filter to smooth output of the up-sampler 101 to generate an up-sampled input signal IN^. Therefore, when the clock signal CK1 is set with a high rate, for a given output slew rate, the step size per DC-DC switching cycle can be reduced, which leads to better resolution and lower THD. In addition, the in-band (<20 KHz) quantization noise will also be reduced due to the higher up-sampling rate. However, since an ADC 107 and DC-DC both run at high rate, the overall power consumed by the driving circuit 10 will rise. Therefore, by setting R to different values, a trade-off between the output resolution (audio quality) and the internal power consumption can be made.

Note that the bit resolution resulting from the up-sampler 101 and low pass filter 102 is generally higher than that of IN, and the increase of the resolution can generally be calculated as $$\left(\frac{f_{IN^\wedge}}{f_{IN}}\right)^{1/2}.$$

For example, if sample rate of IN^ is 768 Ksps=16×48 Ksps and bit resolution of IN is 16 bps, then IN^, having 4× the resolution of IN, should be represented using 18 bit per sample. In alternative embodiment, the up-sampler 101 and low pass filter 102 may be replaced by a ΔΣ encoder which may produce an up-sampled (i.e. over-sampled) IN^ with a per-sample bit resolution significantly lower than the input IN. By virtue of the noise-reshaping characteristic of ΔΣ modulation and the high IN to IN^ over sampling rate, the quantization noise of IN^ will be transfer to inaudible band (>20 KHz) and very high Signal-to-Noise-Ratio (SNR) can be achieved in audible band (<20 KHz) even when the per-sample resolution of IN^ is much lower than that of IN, e.g. 8 bit per sample, opening the door to vastly reduce the complexity of amplifier circuit 10.

The feedback signal FB1 (i.e. related to a real time voltage across the terminals of the load 13) is converted by a differential amplifier 108 to a single-ended feedback signal Vp2n. At the start of each cycle of the clock signal CK1, the single-ended feedback signal Vp2n is sampled by a sample and hold (S/H) within the ADC 107 (e.g. SAR ADC with a S/H input stage), and, after k periods of CK0 during which ADC 107 performs the A/D conversion, a digital value of a digital feedback signal FB corresponding to the value of the single-ended feedback signal Vp2n will be latched to the output of the ADC 107.

Noticeably, in some embodiment, the ADC 107 may include a differential input stage. In that case, the ADC 107 and the differential amplifier 108 may be one entity as indicated by the dashed box and the differential amplifier 108 corresponds to the differential input stage of the ADC 107.

A control circuit 103 may produce a state control signal STA according to the input signal IN and the feedback signal FB1 (e.g. the up-sampled input signal IN^ and the digital feedback signal FB).

In detail, a filter 106 of the control circuit 103 filters the digital feedback signal FB to generate a filtered digital feedback signal FB* with bits-per-sample resolution matched with the up-sampled input signal IN^. Then, the control circuit 103 calculates an actual difference $DLT_{act}$ between the up-sampled input signal IN^ and the filtered digital feedback signal FB* (i.e. $DLT_{act}$=IN^−FB*, representing a delta (Δ) operation). If the actual difference $DLT_{act}$ is greater than a positive specific value, the control circuit 103 generates the state control signal STA indicating a charge operation (i.e. STA=CHARGE), such that the driving circuit 10 forms a charging current from the voltage source 11 to the load 13 during a charging cycle. As a result, the charging current adds a unit voltage change (e.g. ΔV) or a first integral multiple of the unit voltage change (e.g. n×ΔV) on the load 13 during the next DC-DC switching cycle.

On the other hand, if the difference $DLT_{act}$ is less than a negative specific value, the control circuit 103 generates the state control signal STA indicating a discharge operation (i.e. STA=DISCHARGE), such that the driving circuit 10 forms a discharging current from the load 13 back to the voltage source 11 during a discharging cycle. As a result, the discharging current subtracts a unit voltage change (e.g. −ΔV) or a second integral multiple of the unit voltage change (e.g. −n'ΔV) from the load 13 during the next DC-DC switching cycle.

Otherwise, if the difference $DLT_{act}$ lies between the positive specific value and the negative specific value (e.g. −MIN_DLT≤$DLT_{act}$≤MIN_DLT), the control circuit 103 generates the state control signal STA indicating an idle operation (i.e. STA=IDLE), such that the driving circuit 10 does not form the charging current or the discharging current and the voltage $V_L$ of the load 13 remains unchanged during the next DC-DC switching cycle.

Note that, the difference $DLT_{act}$ being $DLT_{act}$=IN^−FB* serves as an embodiment of the present application, which is not limited thereto. In general, the actual difference $DLT_{act}$ can be expressed as $DLT_{act}$=$f_1$(IN)−$f_2$(FB), where $f_1(\bullet)/f_2(\bullet)$ represents a function corresponding to signal processing performed on the signal IN/FB, where the signal processing may be or include a data conversion operation (e.g., digital-to-analog or analog-to-digital conversion), a filter operation, or a multi-rate signal processing (e.g., a down-sampling or an up-sampling operation). As long as $DLT_{act}$ reflects difference between IN and FB, whether or not the signal IN/FB is processed, requirement(s) of the present application is satisfied.

Due to the charge storage nature of the capacitance within the load 13, during each DC-DC switching cycle, the charge flowing into or flowing out of the load 13 will be integrated with the charge in the load 13 prior to DC-DC switching cycle. In other words, a sigma (Σ) operation is performed implicitly by the capacitance within the load 13. Therefore, a sigma-delta (ΣΔ) system is created between the driving circuit 10 and the load 13 by combining the sigma (Σ) operation of the load 13 with the delta (Δ) operation of the control circuit 103. Since the Σ operation of load 13 is an innate behavior of a capacitor, this characteristic may be referred as "auto-ΣΔ". Due to this auto-ΣΔ nature of the driving circuit 10, the effective number of bits of resolution of the driving circuit 10 can be raised significantly by a properly designed FLTR. For example, when the resolution of IN^ and ADC 107 is 8 bits and the FLTR corresponds to that of a $1^{st}$ order ΣΔ system (L=1) then, for CK1=3.072 MHz, oversampled 64 times relative to 48 Ksps, the SNR of circuit 10 within the audible band (20 KHz) may be >110 dB, exceeding the SNR of a 16 bps PCM, 48 Ksps data stream.

Furthermore, when an actual value of the generated unit voltage change (e.g. ΔV) or the generated first integral multiple of the unit voltage change (e.g. n×ΔV) deviates from the targeted amount, the deviation, or the error, will be merged (integrated) with the existing charge in the load 13 (included in the current voltage across the load 13) and will be converted to the digital feedback signal FB during the next CK1 cycle by the ADC 107 and become FB* which will be compared to the up-sampled input signal IN^ to generate the PWM control signals SU and/or SD in the following switching cycles. Therefore, so long as the deviation (i.e. nonlinearity) from the targeted amount of the unit voltage change is not large, such as +/−35% of the unit voltage change, the deviation (or error) from the targeted amount of the unit voltage change ΔV is suppressed in the following switching cycles by the auto-ΣΔ operation, and the linearity of the driving circuit 10 will be determined mainly by the linearity of the ADC 107. In other words, a ΣΔ feedback control loop is formed by a PWM control circuit 151, the charging circuit 12, the discharging circuit 14, the load 13, and the ADC 107, where the unit voltage change ΔV is accumulated by the load 13, re-digitized by the ADC 107 and compensated by PWM control signals SU and/or SD in the following DC-DC switching cycles.

Note that, except for the idle cycle, the feedback control loop involves 1 fixed value of the unit voltage change ΔV, which is not unlike the operation of 1-bit DAC conversion. In comparison with the operation of 1-bit DAC conversion, the idle cycle suppresses switching when the difference $DLT_{act}$ lies between the positive specific value and the negative specific value (e.g. $-MIN\_DLT \le DLT_{act} \le MIN\_DLT$). Although such operation helps to reduce the power consumption by avoiding some of the switching activities, it may lead to reduced output resolution. So, the value of the specific value is generally small and, in some embodiment, the control circuit 103 may choose not to generate the state control signal STA=IDLE indicating the idle operation.

Besides, as analog amplifier needs to address close-loop stability and phase margin, the filter 106 helps the driving circuit 10 to address the same considerations. The filter 106 may be a scaler, a 1-register filter, a bi-quadratic (BiQuad) filter, or have a transfer function suitable for forming a Σ-Δ filter when combined with the auto-Σ operation of load 13.

Figure 2:
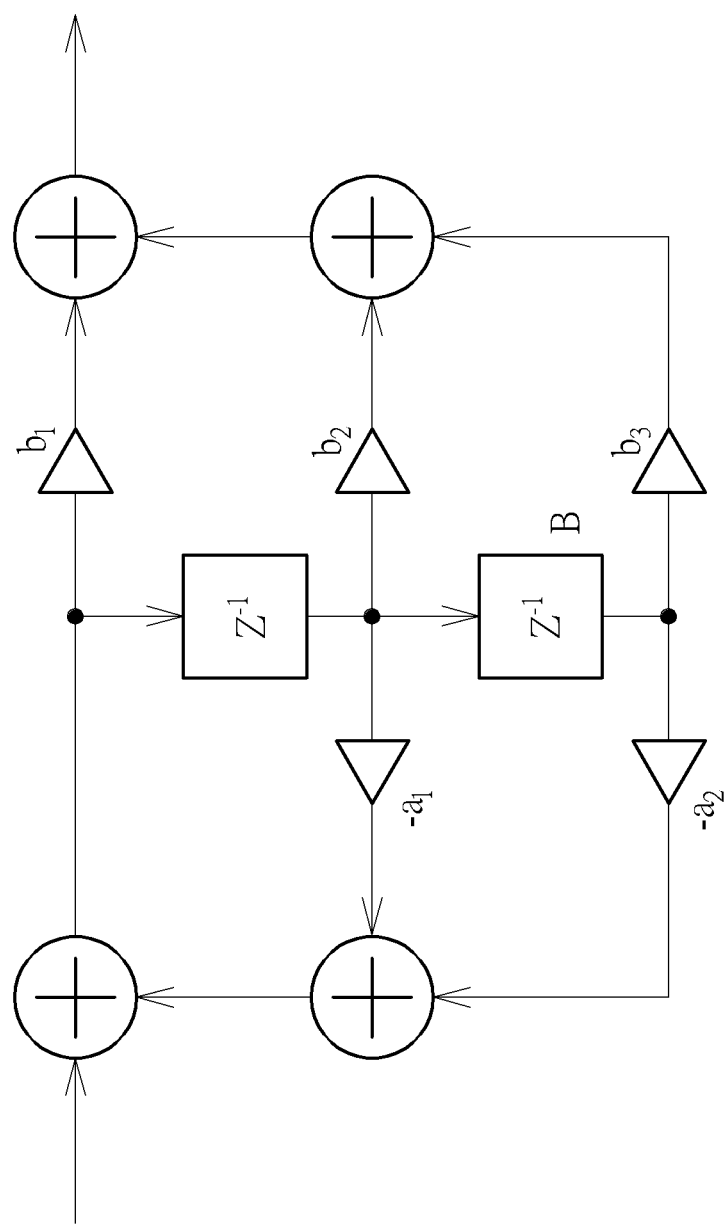
FIG. 2 is a schematic diagram of a conventional BiQuad filter.

Please refer to FIG. 2, which is a schematic diagram of a conventional BiQuad filter. When there is more hardware resource available, a common choice for the filter 106 is an IIR implemented using a BiQuad filter such as the direct-form-2 BiQuad shown in FIG. 2 which is capable of far more sophisticated control than a scaler or a 1-register filter. This form of BiQuad filter requires 7 registers: 2 for states (e.g. $z^{-1}$), 5 for coefficients (a1, a2, b1, b2, b3), and 9 computation steps per signal cycle: 5 multiplications and 4 additions. As a result, the befit of the BiQuad filter comes at the expense of much higher circuit complexity than a scaler or a 1-register filter.

If the filter 106 is a BiQuad filter, the computation of 5 multiplications and 4 additions needs to be finished within a fraction of each 3.072 MHz switching cycle. To simplify the computation requirement, the BiQuad filter may be chosen such that the multiplications corresponding to coefficients b1, b2, b3 are reduced to be implemented by bit-wise shift operations. For example, in a system with 3.072 Msps sample rate, for a $2^{nd}$ order low-pass-filter (LPF2) with Q=0.707, if fc=196,647.43 Hz, the values of b1, b2, b3 become 0.03125, 0.0625, 0.03125, equivalent to right-shift of 5-bit, 4-bit, 5-bit respectively; if fc=131,964.5 Hz, an LPF2 of Q=0.841 will have the values of b1, b2, b3 equivalent to right-shift of 6-bit, 5-bit, 6-bit respectively; if fc=91,203.5 Hz, an LPF2 of Q=0.841 will have the values of b1, b2, b3 equivalent to right-shift of 7-bit, 6-bit, 7-bit respectively; if fc=63,915.6 Hz, a LPF2 of Q=0.707 will have the values of b1, b2, b3 equivalent to right-shift of 8-bit, 7-bit, 8-bit respectively, etc. Therefore, by choosing fc properly, as shown in the examples above, the computation of BiQuad filter may be greatly simplified. Noticeably, this technique is applicable to the filter 106 as well as the up-sampler filter 102.

In the above embodiments, the dynamic range of the ADC 107 and the differential amplifier 108 matches that of the feedback signal FB1 (i.e. related to a voltage across the load 13). For example, if the dynamic range of the feedback signal FB1 is 31V, i.e. max(FB1)−min(FB1)=31V, then the dynamic range of the ADC 107 and the differential amplifier 108 will also be 31V. However, in normal music listening, it is very likely only a fraction of the full dynamic range will be utilized. Under such circumstances, it will be beneficial to adjust the input dynamic range of the ADC 107 and the differential amplifier 108 down accordingly and boost the resolution of the overall system.

Please refer back to FIG. 1, where a scaling control signal k is the power of the scaling factor, e.g. k=2 when scaling factor is 4 or k=3 when scaling factor is 8. When k≠0, the differential amplifier 108 will increase the signal gain by a factor of $2^k$ (i.e. decreasing the dynamic range by a factor of $2^k$). By adjusting dynamic range of the ADC 107 as discussed above, the resolution of the driving circuit 10 will improve by 2-bit when k=2, or by 3-bit when k=3.

The scaling control signal k may be generated by the control circuit 103 by monitoring the current value of the up-sampled input signal IN^ in real time. For example, for a k={0, 2} two-state embodiment, k=2 when a current value of the up-sampled input signal IN^ is less than a fourth of a maximum value of the up-sampled input signal IN^; otherwise, k=0.

Alternatively, k may be controlled by an application processor (AP) through a system bus and the AP may determine the value of k by users' volume settings, by pre-scanning music files, etc., to adjust a dynamic range of the ADC 107.

For applying one level unit voltage change (e.g. ΔV) in each non-idle switching cycle, the unit voltage change ΔV depends on the voltage range of swing of the feedback signal FB1 (i.e. related to a voltage across the load 13), e.g. 31V peak-peak or 22V peak-peak, an upper frequency limit of peak-peak voltage swing, and the resolution of the ADC 107. For example, please refer to the 3rd column of the Table-1 below, where the peak-to-peak swing Vp-p is 31V, a target full swing frequency $f_{full-swing}$ is 4.732 KHz and the rate of DC-DC switching $f_{switching}$ is 3.072 MHz, under these requirements, the maximum slew rate per switching cycle, or ΔV, can be calculated as 31*4.732K*π/3.072M=150 mV. Since 31V/150 mV=207, a per switching-cycle ΔV step size of 150 mV corresponds to a per-switching-cycle resolution of 7.7 bps which will be enhanced to 13.7 bit, relative to 48 Ksps sample rate, after the auto-ΣΔ effect of the driving circuit 10.

TABLE 1

| Vp-p | 31 | 31 | 31 | 31 |
|---|---|---|---|---|
| $f_{switching}$ MHz | 3.072 | 3.072 | 3.072 | 3.072 |
| $f_{full-swing}$ KHz | 6.624 | 5.678 | 4.732 | 0.946 |
| ΔV (mV) | 210 | 180 | 150 | 30 |
| Resolution | 148 | 172 | 207 | 1,033 |
| bps/s · cycle | 7.21 | 7.4 | 7.7 | 10.0 |
| bps w/ΣΔ | 13.2 | 13.4 | 13.7 | 16.0 |
| 48 ksps x | 64 | 64 | 64 | 64 |

Regarding the upper frequency limit of peak-peak voltage swing: The spectrum of human voice is generally below 5 KHz while the spectrum of some music instruments can extend up to 15 Khz. However, in either case, those high-pitch tones are always harmonics of some base notes, which means the amplitude of these high-pitch tones will be low and does not require peak-to-peak voltage swing to produce. Given this background, from the table of examples above, depends on the specific targets of the sound producing device (SPD), designs corresponding to column 1~3 (ΔV=210~150 mV) will all be reasonable choices.

The energy store in a perfect capacitor C can be expressed as $$E_C = \frac{1}{2} C \cdot V^2.$$

Therefore the energy to be injected into or extracted from load 13 to produce a change of $\Delta V$ at $V_L$ can be expressed as:

$$\Delta E_{C13} = \frac{1}{2}C_{13}(V_L) \cdot ((V_L + \Delta V)^2 - V_L^2) = \frac{1}{2}C_{13}(V_L) \cdot (2V_L\Delta V + \Delta V^2) \quad \text{(Eq. 1)}$$

where $C_{13}(V_L)$ is the capacitance of load 13 at $V_L$ including the permittivity variance due to applied voltage. This $\Delta E$ (Eq.1) is true for both the charging cycle and the discharging cycle and it represents the amount of energy needs to be transferred from the voltage power source $V_S$ to the load 13 during a charging cycle or transferred from the load 13 back to the voltage power source $V_S$ during a discharging cycle.

On the other hand, the energy stored in the inductor can be expressed as:

$$E_L = \frac{1}{2}L \cdot I^2.$$

During a DC-DC switching cycle, the current produced during a pulse of width $t_{PWM}$ on the inductor can be expressed as:

$$I = \int \frac{V_{dt}}{L}dt,$$

where $V_m$ is the voltage across the terminals of the inductor L. When $V_m \approx$ constant over $t_{PWM}$, we get $$I = \frac{V_m \cdot t_{PWM}}{L}.$$

Substitute this I into $E_L$ and simplify the terms we get $$E_L = \frac{(V_m \cdot t_{PWM})^2}{2 \cdot L}. \quad \text{(Eq. 2)}$$

Due to the energy conservation principle, the energy stored in inductor L will equal to the energy transfer into (in a charging cycle) or transfer out (in a discharging cycle) of the capacitive load 13. In other words, $E_L = \Delta E_{C13}$ is valid for both the charging cycle and the discharging cycle. Therefore, we have $$\frac{1}{2}C_{13}(V_L) \cdot (2V_L\Delta V + \Delta V^2) = \frac{(V_m \cdot t_{PWM})^2}{2 \cdot L}$$

which leads to $$t_{PWM} = \frac{1}{V_m}\sqrt{C_{13}(V_L) \cdot (2V_L\Delta V + \Delta V^2) \cdot L}. \quad \text{(Eq. 3)}$$

Although Eq.3 applies to both the charging cycle and the discharging cycle, however the expression for $V_m$ is different for the charging circuit than for the discharging circuit. For example, in circuit 10, $V_m = V_S$ for the charging circuit 12, while $V_m \approx V_L + \Delta V/2 - V_S$ for the discharging circuit 14, therefore, for the example of circuit 10:

$$t_{PWM} = \frac{1}{V_S}\sqrt{C_{13}(V_L) \cdot (2V_L\Delta V + \Delta V^2) \cdot L} \quad \text{... for circuit 12.} \quad \text{(Eq. 3C)}$$

$$t_{PWM} = \frac{1}{V_L + \frac{\Delta v}{2} - V_S}\sqrt{C_{13}(V_L)(2V_L\Delta V + \Delta V^2)L} \quad \text{... for circuit 14.} \quad \text{(Eq. 3D)}$$

The PWM control circuit 151 may determine the pulse widths of the PWM signal SD based on Eq.3D and determine the pulse widths of the PWM signal SU based on Eq.3C.

Note that when the load voltage $V_L$ is very close to the supply/source voltage $V_S$ during discharging operation, the pulse width of the PWM signal SD for the discharging circuit 14, as calculated by Eq.3D, may approach infinity. In other words, the goal of reducing $V_L$ by one unit voltage (i.e. reduce by a fixed $\Delta V$) in a switching cycle is unattainable for circuit 14 when the load voltage $V_L$ is very close to the supply/source voltage $V_S$. Therefore, a shunt circuit including a switch S3 is added. When turned on by a control signal SD*, the switch S3 creates a low-resistance path (i.e. forming another discharge current) from the load 13 to the voltage source 11 (or from the load 13 to the ground in other embodiments). Thus, when the pulse width $T_{SW}$, as calculated by Eq.1c, exceeds a pre-determined threshold, a pulse of the control signal SD* is generated and the pulse width of the control signal SD* increases as the pulse width $T_{SW}$ increases. When the control signal SD* activates the current flow path through the switch S3, the discharge currents of the load 13 flow through both the discharging circuit 14 and the switch S3, so as to achieve a fixed $\Delta V$ in each switching cycle.

The above embodiment applies a fixed $\Delta V$ in each switching cycle, and thus even after the auto-$\Sigma\Delta$ effect, resolution is still low, ranging from 13.2-bit to 13.7-bit for column 1-3 of the above table. To improve the resolution of the driving circuit 10, a multi-level $\Delta V$ embodiment is illustrated below.

For the ADC 107 of 10 bps and the peak-to-peak swing Vp-p of 31V, each step in output of the ADC 107 corresponds to a voltage change of $31V/(2^{10}-1)=30$ mV. If a fixed $\Delta V$ of each switching cycle is much larger than 30 mV, such as 120 mV, a phenomenon similar to the analog amplifier ringing may occur, where the output of the driving circuit 10 may bounce between overshooting or undershooting, producing jagged output waveform. Even though this roughness may be largely filtered out by the noise-reshaping characteristic of $\Delta\Sigma$ operation and high SNR, THD can be achieved in the audible band. However, given the high frequency where it occurs, such phenomenon will cause the power consumption to rise. On the other hand, if a fixed $\Delta V$ is significantly smaller than 30 mV, such as 10 mV, as illustrated in the above table, it becomes difficult to raise the full voltage swing frequency $f_{swing}$ above 1 KHz, which may be a disaster for HiFi amplifier.

Therefore, this embodiment includes a multi-$\Delta V$ system (i.e. $V_L$ changes by an integral multiple of a unit voltage change, e.g. $\pm n \times \Delta V$, in each DC-DC switching cycle), where the step size of $\Delta V$ is approximately the same as the resolution voltage level of the ADC 107, e.g. 30 mV. With such arrangement, the operation of the ADC 107 and the charging circuit 12 & the discharging circuit 14 becomes well synchronized. For example, a multi-$\Delta V$ system with $\Delta V$ ranging from −210 mV to +210 mV, in steps of 30 mV, may work with the ADC 107 of 10 bps to produce equivalent resolution of 16 bps in a system level, after considering the auto-$\Sigma\Delta$ effect of the driving circuit 10, while still satisfies the slew rate requirement of the peak-to-peak swing Vp-p of 31V up to 6.6 KHz, which may satisfy most audiophiles, as illustrated in Table-1.

Under such a multi-$\Delta V$ system, the control circuit 103 may calculate the difference $DLT_{act}$ between the up-sampled input signal IN^ and the filtered digital feedback signal FB*, so as to derive at a step-size number NSTP. That is, the step-size number NSTP is determined according to the actual difference $DLT_{act}$. For example, for unit step-size $\Delta V$ of 30 mV, in each non-idle switching cycle, the difference DLT (e.g., the actual difference $DLT_{act}$ or an intended difference $DLT_{ind}$) may correspond to a step-size number NSTP of 1 to 7, to change voltage $V_L$ by $\pm\Delta V$ to $\pm 7\times\Delta V$, in each non-idle switching cycle, which may set an upper limit for a magnitude of the intended difference $DLT_{nd}$ to be no greater than 210 mV. The intended difference $DLT_{ind}$ may represent an increment of the voltage $V_L$ when the charging operation is performed by the directional circuit 12 over a charging switching cycle, or a decrement of the voltage $V_L$ when the discharging operation is performed by the directional circuit 12 over a discharging switching cycle. The voltage $V_L$ represents a load voltage or an output voltage across/of the load 13.

The control circuit 103 may determine the intended voltage difference $DLT_{ind}$ as $DLT_{ind}=NTSP\times\Delta V$. In another perspective, given the unit voltage change $\Delta V$ begin fixed/constant, the determining the intended voltage difference $DLT_{ind}$ and determining the step-size number NSTP are equivalent, meaning that $DLT_{ind}$ and NSTP are both determined according to the actual difference $DLT_{act}$.

When the system of FIG. 1 is well-behaved, the SNR of the system is generally >50 dB, and the deviation between measured $V_L$ and its idea value is generally <1%. Under such condition, the value of actual $V_L$ can be estimated by G×IN^, where G is the gain, which means Eq.3C and Eq.3D can be calculated by replacing $V_L$ by G×IN^. Therefore, the PWM pulse width $t_{PWM}$ required for charging (Eq.3C) and discharging (Eq.3D), for any combination of IN^ and NSTP, can be precalculated, encoded into a pulse width control code and stored in a discharging pulse width look-up table and a charging pulse width look-up table using the corresponding IN^ and NSTP, denoted as (IN^, NSTP), combination as the address. Note, instead of the actual PWM pulse width, the value stored in the look-up table is the control code to be used to generate the desired PWM pulse.

When such table is looked-up, using a specific (IN^, NSTP) as addresses, the entry corresponding to or representing a precalculated pulse width control code for that specific combination of IN^ and NSTP will be retrieved, and this pulse width control code can be used to generate a PWM pulse whose pulse width, $tp_{WM}$, will generate the correct amount of current $I_{CH}$ (or $I_{DIS}$) to produce the desired energy injection according to Eq.3C (or energy extraction o according to Eq.3D) and cause the voltage across the terminals of load 13, $V_L$, to change by NSTP×$\Delta V$ (or −NSTP×$\Delta V$).

Therefore, during each switching cycle, corresponding to one period of the clock signal CK1, the values of the state control signal STA and the step-size number NSTP, as calculated by the control circuit 103, will be combined with the value of the up-sampled input signal IN^ into an address (STA, IN^, NSTP) to select and to access the contents of the discharging pulse width look-up table and the charging pulse width look-up table and retrieve a precalculated control code to be used to generate the PWM signals SD, SU with corresponding pulse widths accordingly by the PWM control circuit 151.

Figure 3:
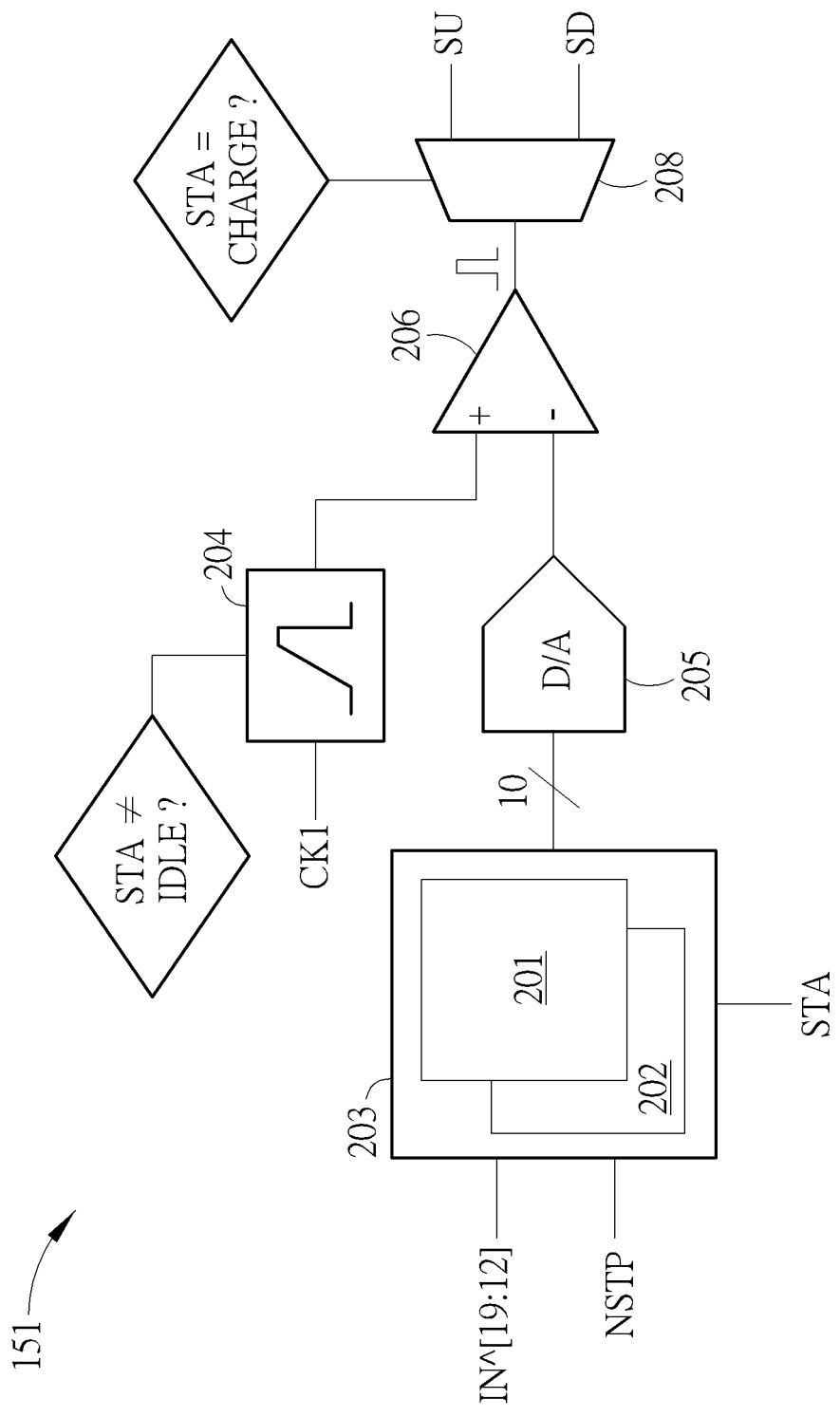
FIG. 3 is a schematic diagram of a PWM controller according to an embodiment of the present application.

Please refer to FIG. 3, which is a schematic diagram of the PWM control circuit 151 according to an embodiment of the present application. As shown in FIG. 3, the PWM control circuit 151 (or, equivalently, the PWM controller 16) comprises a memory 203, a digital-to-analog converter (DAC) 205, a comparator 206, a sawtooth waveform generator 204, and a multiplexor 208. The PWM control circuit 151 generates the PWM signals SU and SD through a charging pulse width look-up table 201 and a discharging pulse width look-up table 202, where the charging pulse width look-up table 201 and a discharging pulse width look-up table 202 are stored in the memory 203. The generation of control signal SD* will be similar and is omitted for brevity. The state control signal STA as calculated by the control circuit 103 may be used to select a suitable one of the charging pulse width look-up table 201 (when STA=CHARGE) and the discharging pulse width look-up table 202 (when STA=DISCHARGE). A specific entry corresponding to a specific discharging pulse width or a specific charging pulse width may then be selected using the up-sampled input signal IN^ and the step-size number NSTP as the address. The selected/specific entry (i.e. the pulse width control code), which may be 6-bit to 10-bit wide, will be converted into a specific analog voltage level by the digital-to-analog converter (DAC) 205. This specific analog voltage may be compared to a sawtooth pulse outputted by the one-shot sawtooth waveform generator 204 by a comparator 206 to produce a pulse whose width will be determined by the interesting points between the sawtooth waveform and the specific analog voltage. The sawtooth waveform generator 204 generates one sawtooth pulse during every switching cycle when the state control signal STA does not indicate an idle operation (i.e. STA≠IDLE). Note that the sawtooth pulse may optionally have a flat tip, whose width corresponds to a preset minimum pulse width. The pulse produced by the comparator 206 is steered by the multiplexor 208 to become either the PWM signal SU or SD depending on the state control signal STA indicates a charge operation or a discharge operation (i.e. STA=CHARGE?).

In the present application, waveform(s) of sawtooth pulse with or without flat tip are named as sawtooth-like waveform. Curve labeled as 204 in FIGS. 4, 6, 7 demonstrates an illustration of sawtooth-like waveform with flat tip. Person skilled in the art may make modifications or alterations accordingly, which is not limited thereto.

Note that, the positive polarities of the sawtooth pulse the PWM pulse shown in FIG. 3 are for illustration only and may be negative in other embodiment. Furthermore, instead of using analog DAC and comparator as 151 of FIG. 3, the pulse SU or SD can also be generated using a digital counter and digital comparator, to name one alternative to generate SU and SD. Therefore, the concepts disclosed in the present application is not restricted by the details of embodiment illustrated in FIG. 3.

To minimize the latency between latching the input of the DAC 205 and the start of the sawtooth waveform generator 204, it is desirable to preset the output of the DAC 205 to a value such that the output of the DAC 205 is close to the starting voltage level of the sawtooth pulse while the state control signal STA and the step-size number NSTP are being computed by the control circuit 103.

Figure 4:
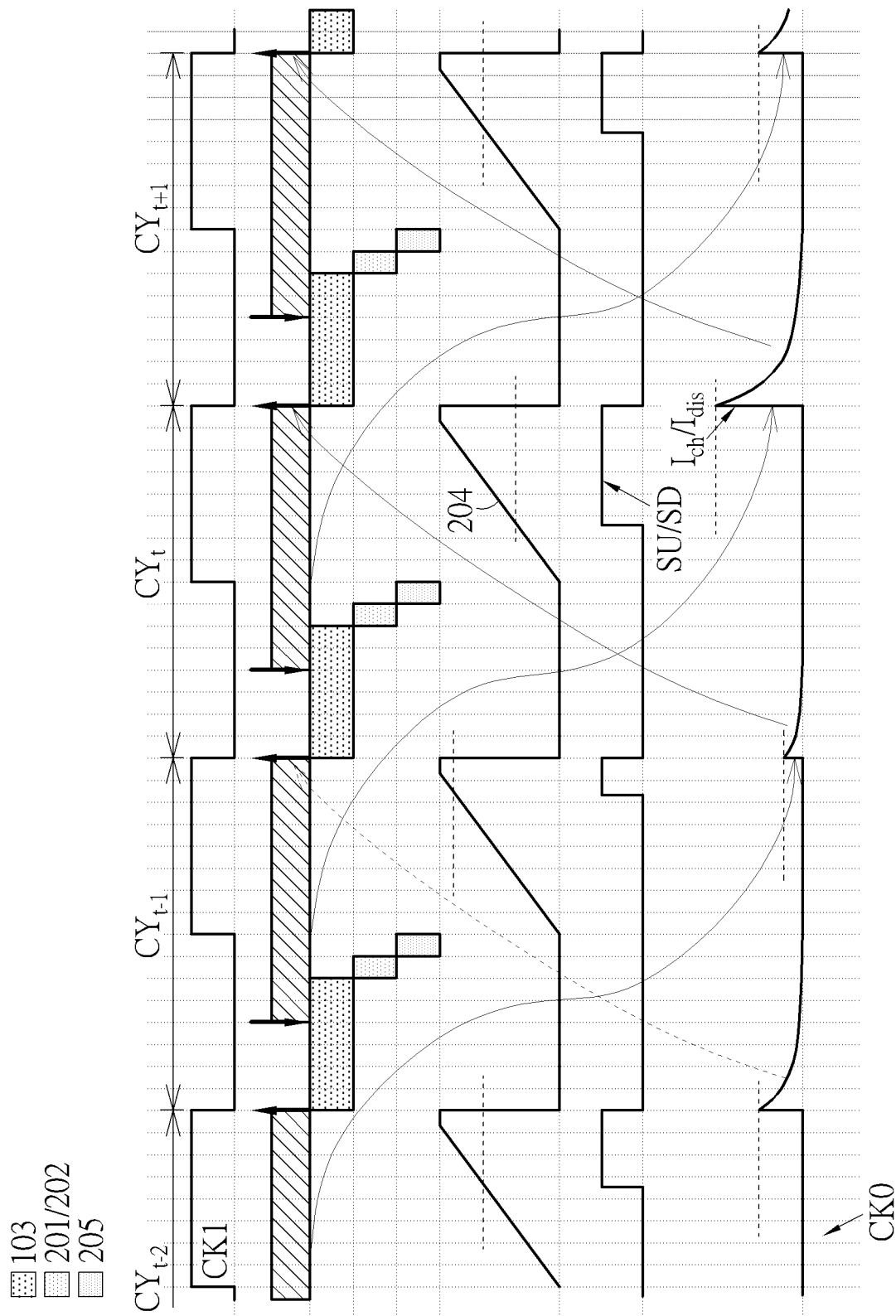
FIG. 4 is a timing diagram of operations of the PWM controller according to an embodiment of the present application.

For example, please refer to FIG. 4, which is a timing diagram of operations of the PWM control circuit 151 according to an embodiment of the present application. As shown in FIG. 4, the output of the DAC 205 for an input 0x3f (max input value for a 6 bit entry, which corresponding to a maximum discharging pulse width or a maximum charging pulse) may correspond to a voltage level slightly above 0V while the output of the DAC 205 for an input 0x00 (min input value) may correspond to a voltage level slightly below the flat-tip portion of the sawtooth pulse generated by the sawtooth waveform generator 204. In the example of FIG. 4, each CK1 cycle corresponds to 16 cycles of CK0, as denoted by vertical dotted lines. During the first 7 cycles of the clock signal CK0 in a cycle $CY_t$ of the clock signal CK1, the DAC 205 may a be in preset state (to be discussed later) such that the output of the DAC 205 settle to 0V. Then, at the rising edge of the $8^{th}$ cycle of the clock signal CK0 in the cycle $CY_t$, the output from the charging pulse width look-up table 201 or the discharging pulse width look-up table 202 is latched by the DAC 205 and the output of DAC 205 will have 1 cycle of the clock signal CK0 to settle before the sawtooth pulse generated by the sawtooth generator 204 starts rising. Note that, for large signal transition of the DAC 205, such as the output swing when input to DAC is 0x30, the relevant voltage level of the sawtooth pulse will arrive 6 cycles of the clock signal CK0 after the start of the sawtooth pulse, which allows a low-power DAC circuit to be utilized for the DAC 205.

The resolution of the up-sampled input signal IN^, which may be up to 18-bit in the embodiment discussed above, is clearly excessive. Therefore, 8 MSB (including sign bit) of the up-sampled input signal IN^ are utilized as addresses of the charging pulse width look-up table 201 and the discharging pulse width look-up table 202, illustrated as IN^[19:12] in FIG. 3, which produces a per-entry $\Delta V_L$ resolution of 31V/256=121 mV for both look-up tables and should be a fine enough resolution in most cases.

With the help of the charging pulse width look-up table 201 and the discharging pulse width look-up table 202, the driving circuit 10 can be viewed as being made up of the collection of $2^8$=256 DC-DC converters, each optimized to produce the desired voltage change n$\Delta V$, corresponding to the step-size number NSTP, within tightly specified ranges of $V_L$. In essence, by addressing the charging pulse width look-up table 201 and the discharging pulse width look-up table 202 with the address (STA, IN^, NSTP), a pre-optimized DC-DC converter, either the charging circuit 12 or the discharging circuit 14, will be brought forward. This specialized DC-DC converter will then be tasked to produce a pre-optimized PWM pulse, according to formula such as Eq.3C and Eq.3D, and generate the desired $V_L$ voltage change n$\Delta V$ according to the step-size number NSTP.

From a system perspective, the components of system 10, from 201-208, the charging circuit 12 or the discharging circuit 14, combined to form a system where the step-size number NSTP is mapped to a linearized voltage change n$\Delta V$, with well-defined unit step size $\Delta V$. In other words, the charging pulse width look-up table 201 and the discharging pulse width look-up table 202 may be viewed as a collection of pre-distortion filters, where factors such as the voltage dependency of $C_{13}(V_{PZT})$, the combined nonlinearity of the DAC 205, the comparator 206, the charging circuit 12 and the discharging circuit 14, the difference between Eq.3C and Eq.3D due to $V_m$, etc., are merged into one all-encompassing equation, which is then piecewise linearized by subdividing the full dynamic range of $V_L$ into a collection of subdivisions of narrow $\Delta V_L$ (the rows of the look-up table, corresponding to IN^), and then each of these $V_L$ subdivisions is populated by a set of precalculated pulse widths (the columns of the look-up table, corresponding to NSTP) such that the resulting voltage change n^V produced by the driving circuit 10 on the loading capacitor of the load 13 becomes linearly correlated to the step-size number NSTP.

Note that the address for the charging pulse width look-up table 201 and the discharging pulse width look-up table 202 shown in FIG. 3 is (IN^[19:12], NSTP) which is the most flexible and straightforward way to cover any kind of relationship between the up-sampled input signal IN^ and the step-size number NSTP.

A conventional DAC receives continuous changing input signal and the output of the conventional DAC needs to produce the corresponding analog signal following the input continuously and one of the critical parameter for the conventional DAC is the time its output takes to settle between two consecutive input value change (i.e. settle time). In other words, for the conventional DAC, during each conversion cycle, the starting point, both input digital code and output voltage level, can be anywhere within the spec of the conventional DAC and ending point can also be anywhere else within the spec of the conventional DAC, and output of the conventional DAC needs to be able to transition from the starting voltage level to the ending voltage level within the cycle time. As discussed in association with timing diagram FIG. 4, these operating conditions do not need to constrain the implementation of the DAC 205 and the ramp of sawtooth waveform may start before the large amplitude swing of DAC output has settled.

Figure 5:
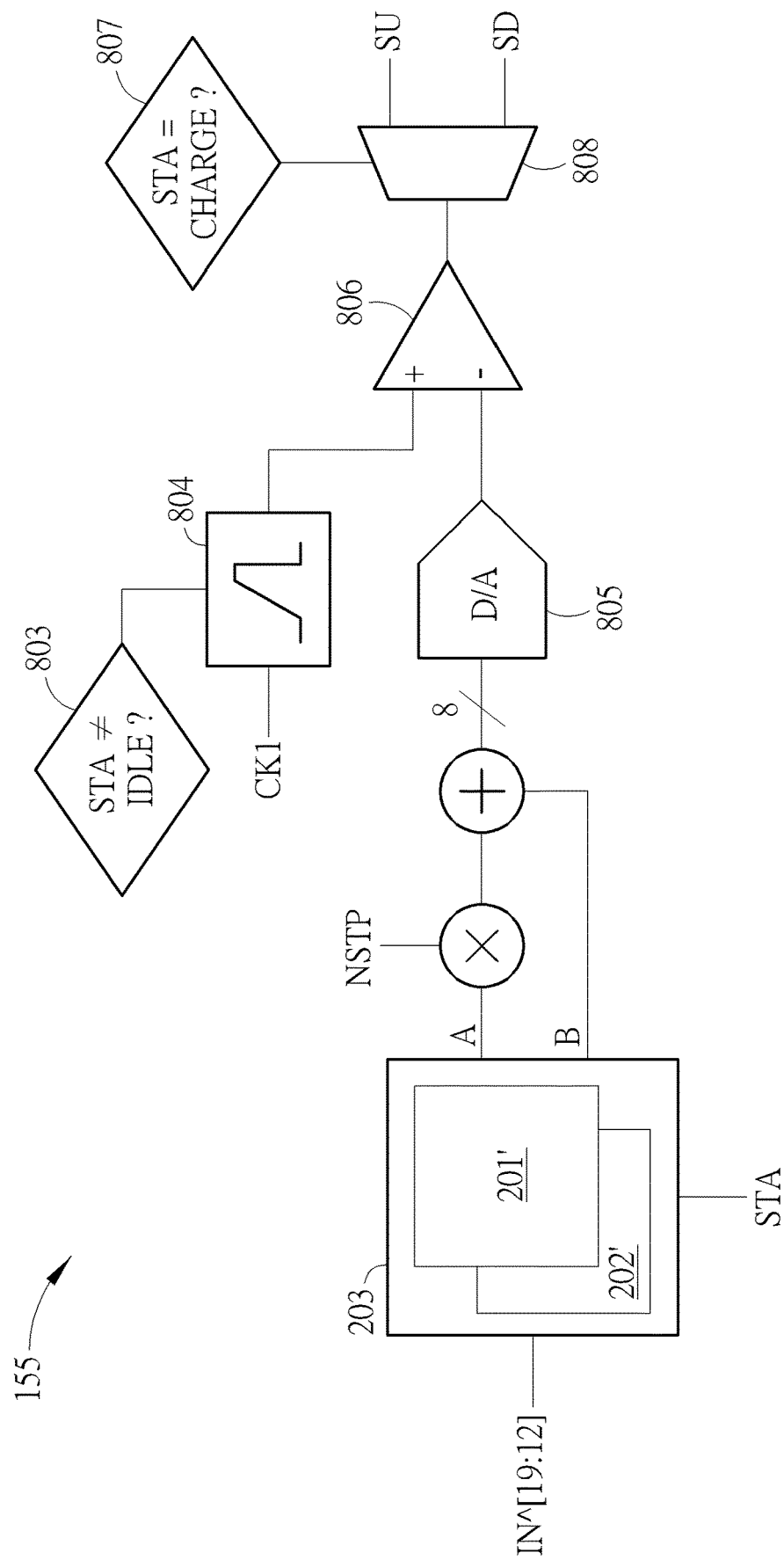
FIG. 5 is a schematic diagram of the PWM controller according to another embodiment of the present application.

However, please refer to FIG. 5, which is a schematic diagram of the PWM control circuit 155 according to another embodiment of the present application. When the PWM pulse width (or pulse width control code) $T_{SW}$ for a given value of the up-sampled input signal IN^ can be expressed as $T_{SW}$=A×NSTP+B for different value of NSTP, then the table of $2^8$ NSTP entries can be reduced to a table of $2^8$×2 entries (2 for A and B) and the specific entry for the input to the DAC 205 can be extracted by addition and multiplication as: A×NSTP+B. Even though the size of the charging pulse width look-up table 201' and the discharging pulse width look-up table 202' will be reduced, the complexity of generating the input for the DAC 205 will increase as a result. In addition, while schematics 151 of FIG. 3 can handle arbitrary relationship regarding NSTP, the schematics 155 of FIG. 5 can only handle case where the PWM pulse width $t_{PWM}$ is linearly related to NSTP.

Another way to minimize the size of the charging pulse width look-up table 201 and the discharging pulse width look-up table 202 is to examine the table entries, identify entries with identical output, replace these entries with a common entry, and then optimize the resulting address-content mapping using techniques such as logic minimization, etc.

The above embodiment has a 1-to-1 relationship between ADC cycle and DC-DC switching cycles. In other embodiments, one ADC cycle of the ADC 107 corresponds to a plurality of switching cycles may be implemented.

Figure 6:
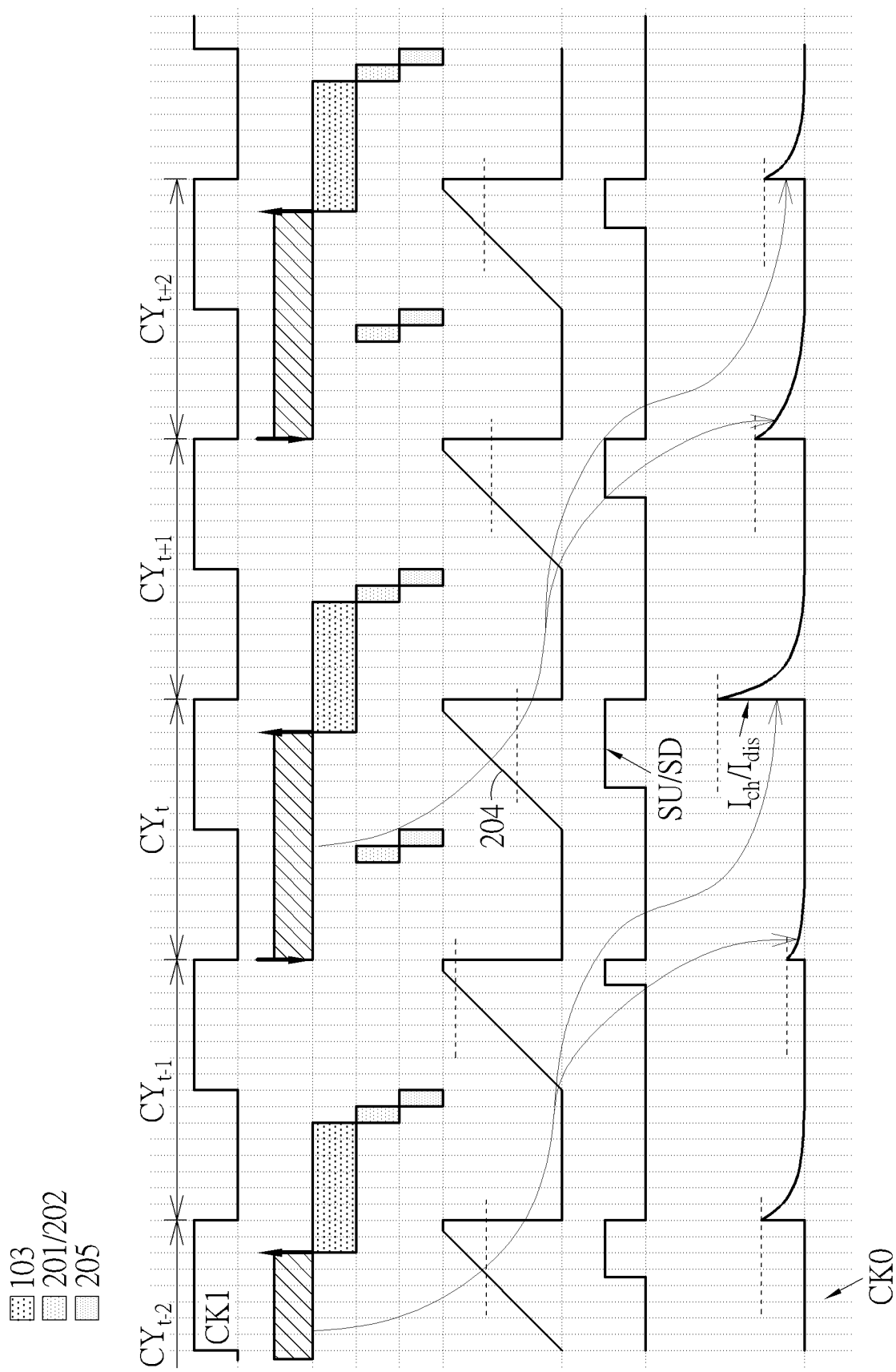
FIG. 6 is a timing diagram of operations of the PWM controller according to another embodiment of the present application.

Please refer to FIG. 6, which is a timing diagram of operations of the PWM control circuit 151 according to another embodiment of the present application. As shown in FIG. 6, the ADC 107 samples its input at thick down arrows (input) and completes A/D conversion at thick up arrows (output), producing FB at the $14^{th}$ falling edges of CK0 between cycles CYt−2 & CYt−1, CYt & CYt+1 and CYt+2 & CYt+3, and produces the step-size number NSTP and the state control signal STA in the subsequent eight cycles of the clock signal CK0 which would be applied to two DC-DC switching cycles for each sample of the ADC 107.

In an embodiment, controller 103 may perform a linear interpolation between two entries from the charging pulse width look-up table 201 or the discharging pulse width look-up table 202 to achieve ΔV resolution finer than then the precalculated step size of ΔV. For example, output $V_L$ voltage change ΔV of 97.5 mV can be derived from one DC-DC switching cycles according to a look-up table entry corresponding ΔV=120 mV and three DC-DC switching cycles according to a look-up table entry corresponding ΔV=90 mV, i.e. use Look_up(120 mV)+3×Look_up(90 mV)+2)/4 to substitute Look_up(97.5 mV). Compared to quadrupling the resolution of circuit 12 and circuit 14 and expanding the charging pulse width look-up table 201 and the discharging pulse width look-up table 202 by 4 times, the linear interpolation can be implemented far more economically.

Figure 7:
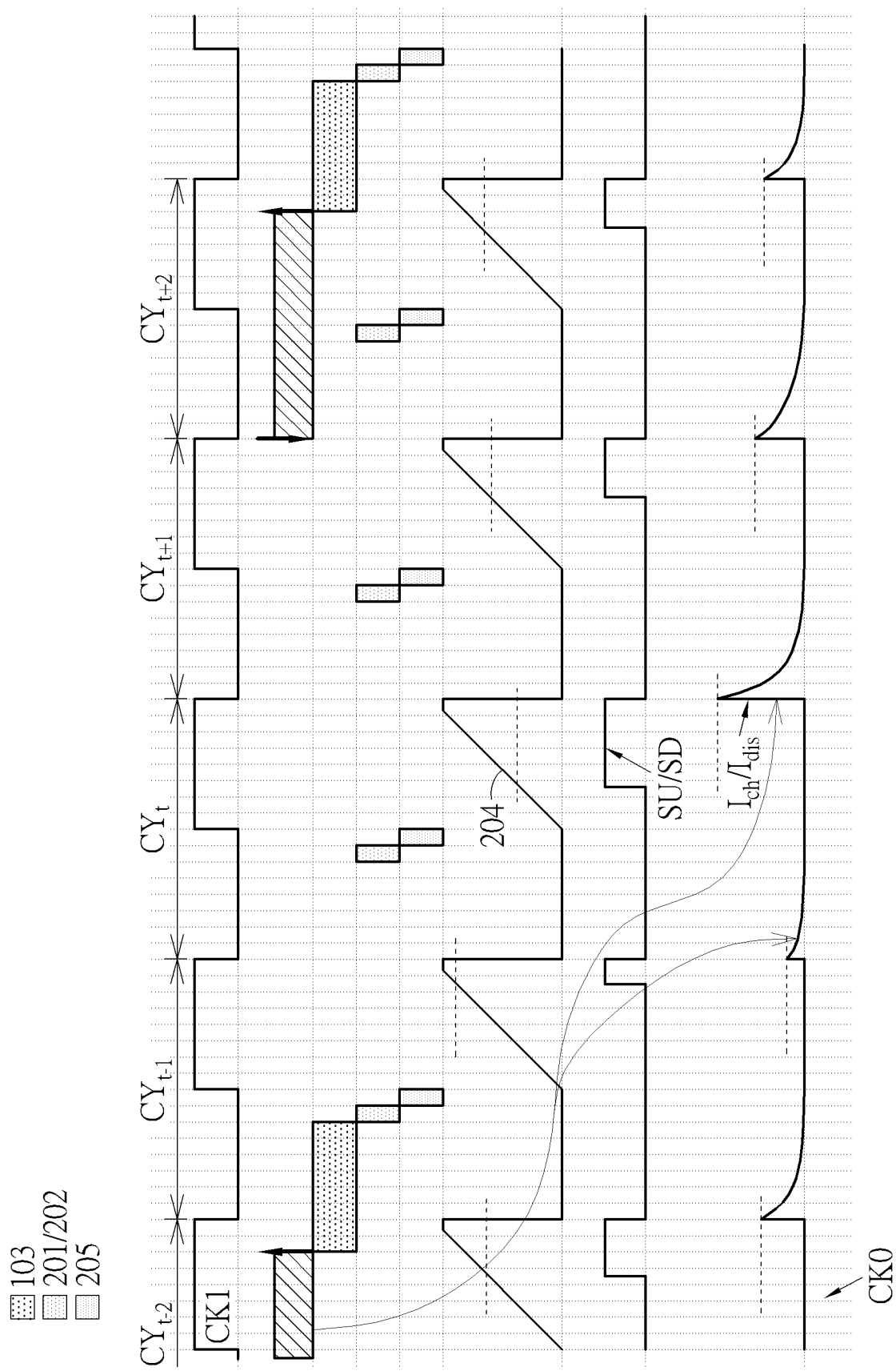
FIG. 7 is a timing diagram of operations of the PWM controller according to another embodiment of the present application.

Please refer to FIG. 7, which is a schematic diagram of operations of the PWM control circuit 151 according to another embodiment of the present application. The step-size number NSTP and the state control signal STA calculated from each sample of the ADC 107 are applied to four DC-DC switching cycles, instead of two DC-DC switching cycles as in FIG. 6. Therefore, comparing to the embodiment based on FIG. 6, the embodiments based on FIG. 7 will cut the power consumed by the ADC 107, the charging pulse width look-up table 201, the discharging pulse width look-up table 202 and the DAC 205 in half, at the expense of losing ½ of the output resolution levels. System designers may choose between FIG. 6 and FIG. 7 depending on the priority of each design. Alternatively, a dynamic switch between FIG. 6 and FIG. 7 may be implemented by the control circuit 103, either under direct control from a host computer, or by detecting a predetermined condition of the input signal IN, such as the input signal IN<MAX VALUE/ 32, (−30 dB, peak-to-peak≤1V) indicating lower power consumption most likely desirable.

Power-supply-rejection-ratio (PSRR) is a critical parameter for any audio amplifier. Assuming a high stability bandgap voltage reference is used to control the operation of the ADC 107, the driving circuit 10, whose output is controlled by the ADC 107, can exhibit high PSRR without explicit circuit dedicated to address the fluctuation of the voltage source 11. In situations where the voltage level of power source 11 can vary widely and it may become desirable to further improve PSRR by expanding the charging pulse width look-up table 201 and the discharging pulse width look-up table 202 into multiple subdivisions, each contains precalculated pulse widths tuned to a specific range of $V_S$, e.g., [5.1V~5.36V], [5.37V~5.63V], [5.64~5.9V], and the address for look-up tables 201 and 202 may be augmented to be (VSR, IN', NSTP) where VSR is the $V_S$ range indicator, generated by a $V_S$ monitoring circuit, such that, when the supply/source voltage $V_S$ changes, the specific precalculated pulse widths retrieved from the look-up table will automatically adjust to compensate for the change of the supply/source voltage Vs according to an all-encompassing formula such as Eq.3C and/or Eq.3D.

Please refer back to FIG. 4 for a timing relationship between various blocks of the driving circuit 10. Note that, the signal sampled at S/H of the ADC 107 in the cycle $CY_t$ will produce the current $I_{ch}/I_{dis}$ during the cycle $CY_{t+1}$ whose corresponding change over terminals of the load 13 will be sample at S/H of the ADC 107 in the cycle $CY_{t+2}$. This means there is a 1-switching-cycle delay between these signals. Also refer to FIG. 6 and FIG. 7, where delays of more than 1-switching-cycle may exist. Such delays, if left unattended, may cause oscillation and therefore needs to be dealt with care. The filter 106 manages such instability factors to achieve highly stable operation and high SNR.

Noticeably, in the above embodiments, the PWM controller 16 is applied in the driving circuit 10 with the charging circuit 12 (as the boost converter) and the discharging circuit 14 (as the buck converter). In other embodiments, the PWM controller 16 may be applied in driving circuit with other circuit configurations for charging and discharging (e.g. other circuit configurations of U.S. application Ser. No. 17/022,106 or a 4 transistor bidirectional circuit capable of forming charging current and discharging current with different control signals).

Speaking form a broad perspective, the central concept of this application is about utilizing mapping tables, such as 201 and 202, to subdivide the input-output value mapping of the control of any system (such as the voltage amplifier 10 of FIG. 1) into a multitude of small regions, such as the 256 regions corresponding to IN^[19:12] in FIG. 3, and then model the behavior of system within each of the small input-output mapping region by a set of precalculated output value control signals, such as the plurality of entries corresponding to each IN^[19:12], addressed by NSTP in FIG. 3. Note that the application of this general scheme is unlimited: not limited to system 10, not limited to charging-discharging operation, not limited to a voltage-output system, and certainly not limited to any embodiment details such as 256 subdivisions, etc.

In another aspect, the PWM width $T_{SW}$ can become very narrow and will need to be very finely controlled when output $V_L$ of the charging circuit 12 is very close to 0V (see Eq.3C) or when output $V_L$ of the discharging circuit 14 is much higher than $V_S$ (see Eq.3C). In order to achieve such finely controlled PWM pulse width $T_{SW}$, a high-resolution DAC (such as 12 or 14 bps) may be required for implementing the DAC 205. However, such fine resolution is required only when the pulse width is narrow, therefore, an exponential DAC where the output corresponds to $k^V$, will be a more efficient implementation of the DAC 205. For example, a range of $2^{12}$ can be encoded by $1.14114^{63}$, where k=1.14114, v=0~63. Therefore, in one aspect, the present invention use a 6-bit v to represent a range that would have required a linear representation of close to $2^{12}$ linear codes and therefore represents a complexity reduction of DAC circuit by $2^{(12-6)} \approx 64$ times.

Figure 8:
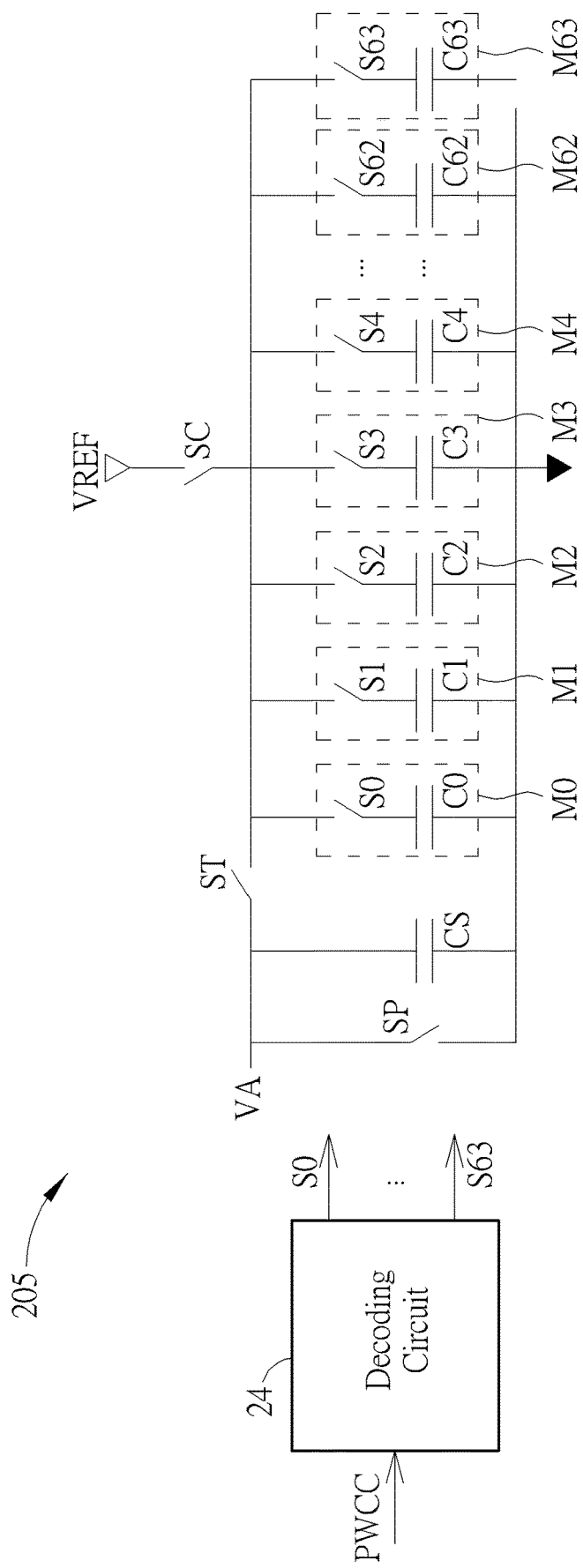
FIG. 8 is a schematic diagram of a DAC according to an embodiment of the present application.
Figure 9:
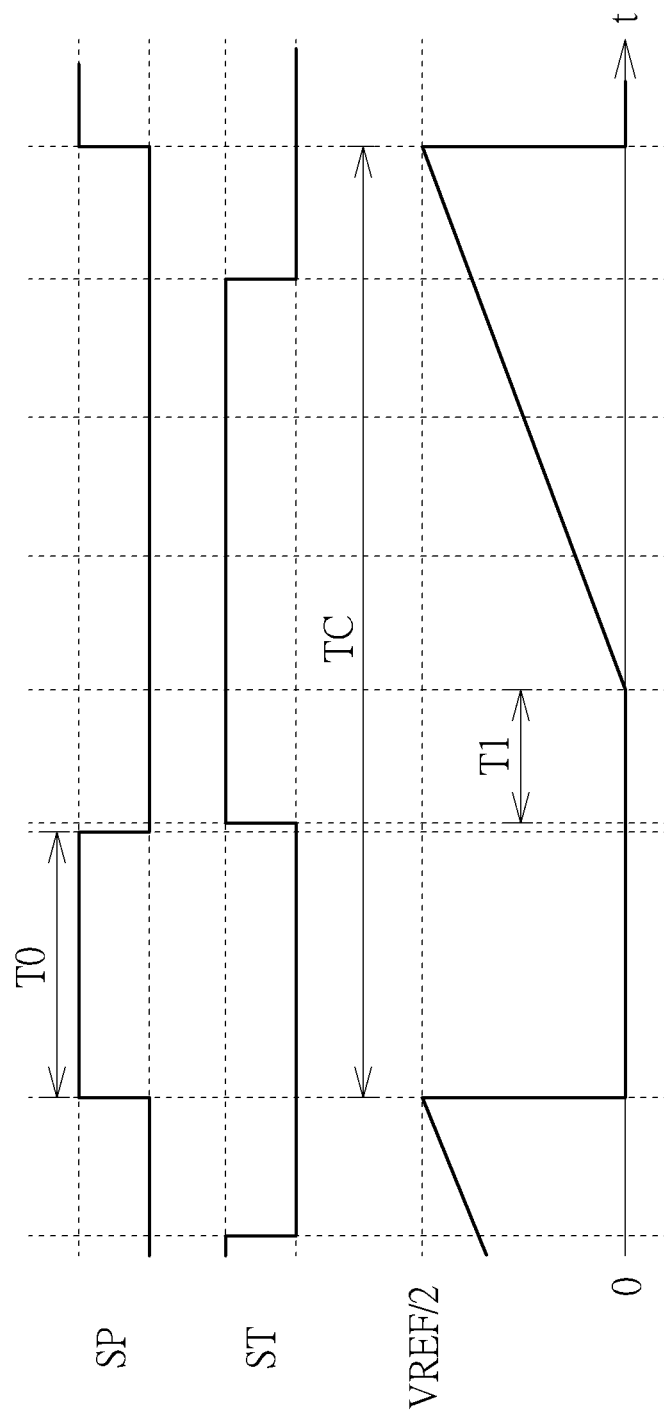
FIG. 9 is a timing diagram of operations of the DAC shown in FIG. 8 according to an embodiment of the present application.

Please refer to FIG. 8 and FIG. 9. FIG. 8 is a schematic diagram of the DAC 205 according to an embodiment of the present application. FIG. 9 is a timing diagram of operations of the DAC 205 shown in FIG. 8 according to an embodiment of the present application. As shown in FIG. 8, the DAC 205 comprises a plurality of reference modules M0-M63, a charging switch SC, an output capacitor CS, a sharing switch ST, a discharging switch SP. The reference modules M0-M63 are mutually connected in parallel. Each reference module Mn comprises a reference capacitor Cn and a reference resistor Rn connected in series.

The output capacitor CS includes a first terminal coupled to the ground, and a second terminal for outputting the specific analog voltage VA. A discharging switch SP is coupled between the first terminal and the second terminal of the output capacitor CS. A pre-charging switch SC includes a first terminal coupled to a reference voltage VREF, and a second terminal. In an embodiment, the reference switches S0-S63 include a plurality of first terminals coupled to the second terminal of the pre-charging switch SC, and a plurality of second terminals. The reference capacitors C0-C63 include a plurality of first terminals, each coupled to the second terminal of its corresponding switches S0-S63, and a plurality of second terminals coupled to the ground. A charge redistribution switch ST is coupled between the first terminal of the output capacitor CS and the first terminals of the reference capacitors C0-C63.

Under such a configuration, the DAC 205 may utilize a charge redistribution scheme to perform digital-to-analog conversion on a specific entry (control code) to generate the specific analog voltage VA. In detail, as shown in FIG. 8 and FIG. 9, during a preset phase, indicated by time period T0, the discharging switch SP, the pre-charging switch SC and the reference switches S0-S63 are turned on (logic 1) and the charge redistribution switch ST is turned off (logic 0), to discharge the output capacitor CS (bring the voltage across the terminals of the output capacitor CS to 0V) and to pre-charge the reference capacitors C0-C63 (bring the voltages across the terminals of the reference capacitors C0-C63 to reference voltage VREF). At the end of the preset phase, the discharging switch SP, the pre-charging switch SC and a subset of the reference switches S0-S63 (not selected by the specific entry) are turned off first. After a short instant, sufficient to avoid current shot-through VREF→SC→ST→SP→ground, the conversion phase starts by turning on the charge redistribution/sharing switch ST, indicated by time period T1, such that electric current stars flowing from the subset of the reference capacitors C0-C63 selected by the specific entry to remain connected to charge redistribution switch ST via corresponding reference switches S0-S63, to charge the output capacitor CS and to generate the specific analog voltage VA.

In addition, the DAC 205 further comprises a decoding circuit 24. The decoding circuit 24 is configured to receive the pulse width control code (PWCC) obtained by the PWN control circuit 151/155 (or, equivalently, by the PWM controller 16) and to perform a decoding operation to generate a plurality of control signals S0-S63 according to the PWCC, so as to control the plurality of reference switches S0-S63. The decoding operation may be the thermometer decoding, binary decoding or 1-hot decoding, etc. FIG. 8 and FIG. 9, SP, ST and S0-S63 not only denotes the switches but also denotes the corresponding switch control signals.

In first embodiment A of the DAC circuit 205 where reference capacitances of the reference capacitors C0-C63 and the output capacitor CS are configured as an exponential order $Cn=12fF*1.167^n$, n=0-63, CS=C63 and during the conversion phase one and only one out of the reference switches S0-S63 stays ON, i.e. 1-hot decoder. During the conversion phase when charge redistribution switch ST is turned ON, the specific analog voltage VA will settle to a voltage calculated as $$\frac{VREF \times Cn}{Cn + CS}$$

such that the specific analog voltage VA will have a voltage level between VREF/2 (when n=63) and slightly above GND (when n=0) according to digital values of the specific entry. As a result, the DAC 205 may finely control the pulse width $T_{SW}$ for voltage change $+\Delta V$ when $V_L \rightarrow 0V$ for the charging circuit 12 or for voltage change $-\Delta V$ when $V_L \gg V_S$ for the discharging circuit 14.

In an alternative embodiment B of the DAC circuit 205, C0=12fF, $Cn=12fF*(1.167^n-1.167^{n-1})$ for n=1-63 (a plurality of sequential added reference capacitances are in an exponential order $\Sigma_{i=n}^{n}C_i=12fF*1.167^n$) and the reference switches S0-S63 may be controlled by a thermometer decoder, i.e. at the end of the preset phase when the discharging switch SP goes from logic high to low, the reference switches Sn+1-S63 are turned off while the reference switches S0-Sn stay ON, and $CS=\Sigma_{i=0}^{63}C_i$ (i.e. a total reference capacitance of the plurality of reference capacitances). Thus, embodiment B has the same voltage level of the specific analog voltage VA to n relationship as previous embodiment A.

Embodiment B has the advantage of requiring less total capacitance than embodiment A. Since capacitance costs silicon, it is therefore clearly advantageous to adopt embodiment B. However, for small n, capacitance of the reference capacitor Cn may be very small in embodiment B. For example, for $C1=12fF\times(1.167-1.167^0)=2fF$ which is very small, and the actual capacitance, in single chip implementation, can easily fluctuate a high-% from chip to chip. Therefore, a hybrid between embodiment A and embodiment B may be employed to implement as embodiment C, i.e. Cn is implemented as one-hot scheme for n<m and as thermometer code for n≥m.

For example, let m=13 in embodiment C, the corresponding capacitance of the reference capacitor C13 for thermometer code will be $C13=12fF\times(1.167^{13}-1.167^{12})=12.786fF$, i.e. the smallest capacitance of this embodiment C using hybrid encoding scheme will be C0=12fF. That is, e.g. reference capacitances of the reference capacitors C0C12 and sequentially added reference capacitances of the reference capacitances of the reference capacitors C13-C63 are in an exponential order, and an output capacitance of the output capacitor CS is equal to a total reference capacitance of the plurality of second reference capacitances. Therefore, embodiment C sets an upper bound as to what is magnitude fluctuation of the capacitance of the reference capacitor Cn may be while minimizing the total capacitance that is required.

In another embodiment D of the DAC circuit 205, reference capacitances of the reference capacitors C0-C63 may be all equals to 12fF (which implies the reference capacitances of the reference capacitors C0-C63 are identical or substantially identical), and let the capacitance of CS be $$\frac{1}{8}\sum_{i=0}^{63} C_i = 8 \times C0 = 96fF.$$

When reference switches S0~S63 is encoded/decoded in either binary code or thermometer code, the VA produced for a control code n can be expressed as:

$$VA_n = \frac{\sum_{i=0}^{n} C_i}{CS + \sum_{i=0}^{n} C_i} V_{REF} = \frac{n+1}{8+n+1} V_{REF}.$$

Note that the change of VA is nonlinear and diminishes as n increases. For example, for n=0→1, $\Delta VA_{0\_1}=VA_1-VA_0=2/10-1/9\approx0.088889\times V_{REF}$, and for n=62→63, $\Delta VA_{62\_63}=VA_{63}-VA_{62}=64/72-63/71\approx0.001565\times V_{REF}$ and the ratio of $$\Delta VA_{0 \to 1} : \Delta VA_{62 \to 63} = \frac{0.088889}{0.001565} = 56.8.$$

In other words, the increment of PWM pulse width $T_{SW}$ is 56.8 finer for n=62→n=63 than the increment of PWM pulse width $T_{SW}$ for n=0→n=1. By replacing the down-swing ramp shown in FIG. 9 with an up-swing sawtooth ramp, and by replacing n with n'=63−n, a DAC 205 based on embodiment D can produce a series of quasi-exponential PWM pulses with finely stepped pulse width $T_{SW}$ when n' is small and will be suitable for controlling the charging circuit 12 or the discharging circuit 14.

In other words, in an embodiment, the reference capacitances of the reference capacitors C0-C63 are identical. The reference switches S0-S63 are controlled by control signals, and the control signals are corresponding to a control code (e.g., the pulse width control code) or generated according to the control code (e.g., the pulse width control code). In an embodiment, the control signals for the reference switches S0-S63 may generated by the decoding circuit 24 according to the (pulse width) control code.

The DAC 205 converts the (pulse width) control code into the analog voltage VA.

Different from conventional DAC in the art, in the present application, the analog difference $\Delta VA_n = \Delta VA_{(n-1) \to n} = VA_n - VA_{n-1}$ may monotonically increase or monotonically decrease as n increases. Herein, n may denote a (digital) value represented by the corresponding control code or the control code itself (n−1) represents a valve of a control code which the control code n is consecutive to, or control code (which the control code n is consecutive to) itself. Whether $\Delta VA_n$ increases as n increases or $\Delta VA_n$ decreases as n increases depends on the decoding operation or how the decoding circuit 24 generates the control signals. As long as $\Delta VA_n$ has monotonic (either increasing or decreasing) relationship with the control code value n, requirement of the present application is satisfied.

In addition, an equivalent capacitance $C_{eq}$ of the reference modules M0-M63 may have monotonic (either increasing or decreasing) relationship with the control code value n. Furthermore, suppose K denotes a number of conducted reference switches within the conversion phase corresponding to the control code n, the number K may have monotonic (either increasing or decreasing) relationship with the control code value n, especially in the condition that all reference capacitances are identical. Therefore, the analog difference $\Delta VA_n$ may monotonically increase or monotonically decrease as the equivalent capacitance $C_{eq}$ increases, or the analog difference $\Delta VA_n$ may monotonically increase or monotonically decrease as the number K increases.

In addition, the analog voltage VA has a nonlinear relationship with the control code value n. Nonlinearity means that, in one perspective, the analog voltage VA produced by the DAC 205 has a property of $VA_{n+k} \neq VA_n + VA_k$, where $VA_{n/k}$ represents the analog voltage corresponding to the control code n/k.

After the specific analog voltage VA is generated by the DAC 205, the specific analog voltage VA is compared to the sawtooth pulse generated by the sawtooth waveform generator 204. As shown in FIG. 9 (the sawtooth pulse shown in FIG. 9 is negative, ramping toward ground, while the sawtooth pulse shown in FIG. 3 is positive, ramping toward VREF, and thus operations are correspondingly modified), a time period T1 exists between the start of the DAC conversion phase and the start of the ramping of the sawtooth pulse generated by the sawtooth waveform generator 204. The time period T1 allows the current flow through the sharing switch ST to settle before the sawtooth pulse starts ramping and the time period T1 is determined by the Ron of charge redistribution switch ST and switching S0, the capacitance of the reference capacitor C0 and the output capacitor CS.

Compared with the conventional DAC such as R-2R structure, since the capacitance Cgs associated with the sharing switch ST may almost always be 100 times smaller than $(CS+\Sigma_{i=0}^{63} C_i)$, the time period T1 is essentially independent of the overall power consumption of the DAC 205, which is determined mainly by the power consumed by the output capacitor CS and the reference capacitors C0-C63 which has an upper bound of $C63*VREF^2*f$ for embodiment A or $\Sigma_{i=0}^{63} C_i * VREF^2 * f$ for embodiment B.

During the preset phase (time period T0) of a cycle TC, the reference capacitors C0-C63 may be pre-charged to the reference voltage VREF and the output capacitor CS is pre-discharged. During the subsequent conversion phase, some of the reference capacitors C0-C63 may be partially discharged via connection to the output capacitor CS. Note that, for a capacitor Ci which is not connected to the output capacitor CS (i.e. a corresponding reference switch Si is turned off) during the conversion phase, the charge is retained into the next cycle TC, and therefore consumes no power. Only a capacitor Cj that has been connected to the output capacitor CS during the TC cycle will be recharged to replenish the charge transferred to CS during the conversion phase. In other words, the power consumed during each cycle TC is automatically minimized based on the input codes of the specific entry. The lower is the specific analog voltage VA, the lower is the power consumed during the cycle TC.

Note that the relationship between the sawtooth pulse generated by the sawtooth waveform generator 204 and the reference capacitors C0-C63, pre-discharge of the output capacitor CS shown in FIG. 8 and FIG. 9 only illustrate the operations of the DAC 205 and the PWM control circuit 151. Other combinations can be utilized to achieve similar results and all such variations are within the scope of the present application.

Figure 10:
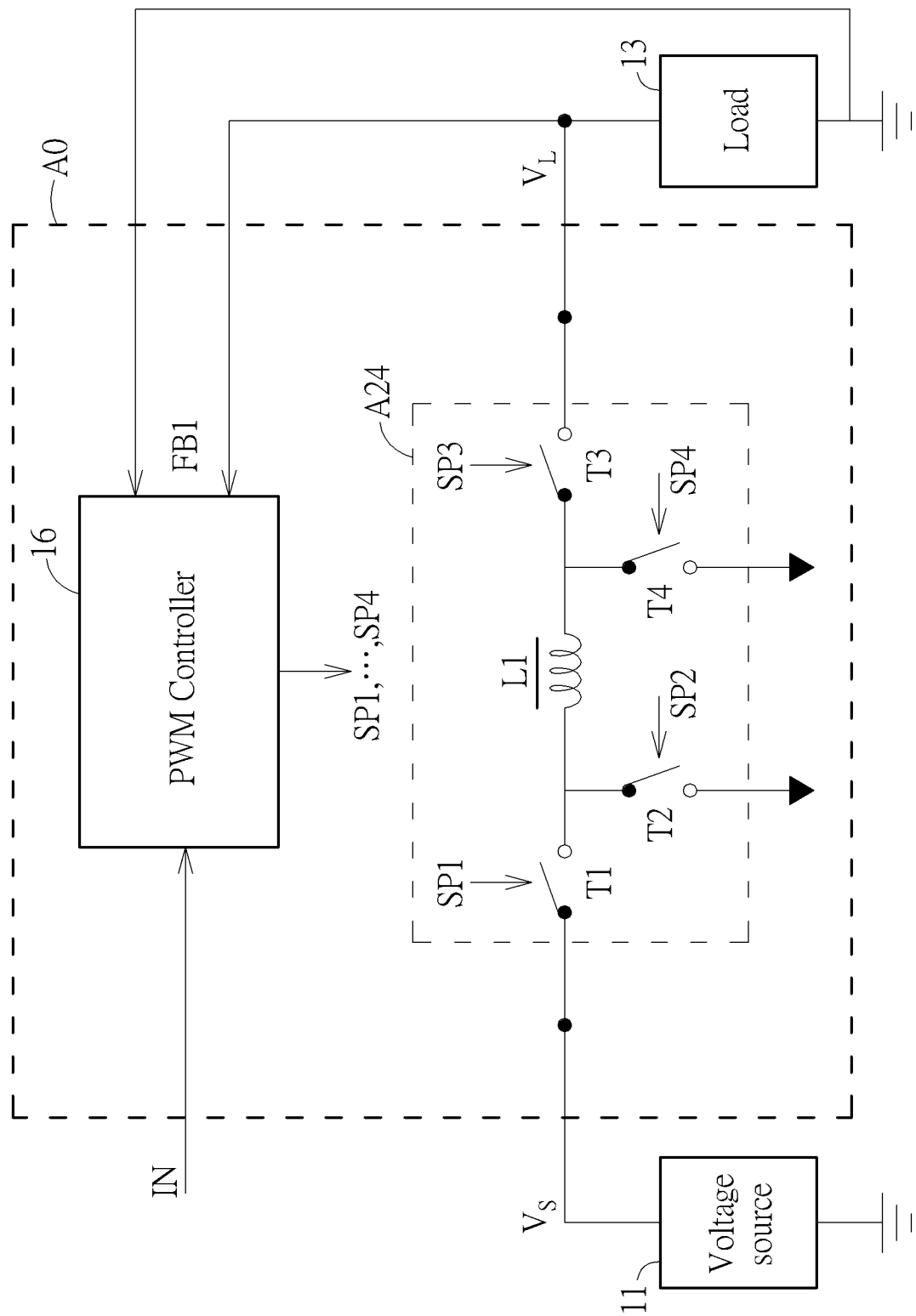
FIG. 10 is a schematic diagram of a driving circuit according to an embodiment of the present application.

The topology of the bidirectional circuit is not limited to which in FIG. 1. Other bidirectional circuits, such as the 4-transistor (4T) circuit disclosed in U.S. patent application Ser. No. 17/352,346, may be used, as shown in FIG. 10. FIG. 10 illustrates a driving circuit AO comprising the PWM controller 16 and a bidirectional circuit A24, which is a 4T bidirectional circuit capable of forming the charging current $I_{ch}$ from the voltage source 11 to the load 13 and forming the discharging current $I_{dis}$ to from the load 13 back to the voltage source 11. Furthermore, for the bidirectional circuit A24, which is derived from the buck-boost converter, the restriction of $V_L > V_S$ does not apply, and various schemes were illustrated in application Ser. No. 17/352,346 to allow the voltage level of $V_L$ to go above, go below and go across the voltage level of $V_S$, so long as the PWM controller 16 is adapted to generate the PWM control signals, SP1-SP4, suitable for controlling the 4T circuit of application Ser. No. 17/352,346. Such adaption will be obvious to those skill in the art of electronics design and is omitted herein for brevity.

Figure 11:
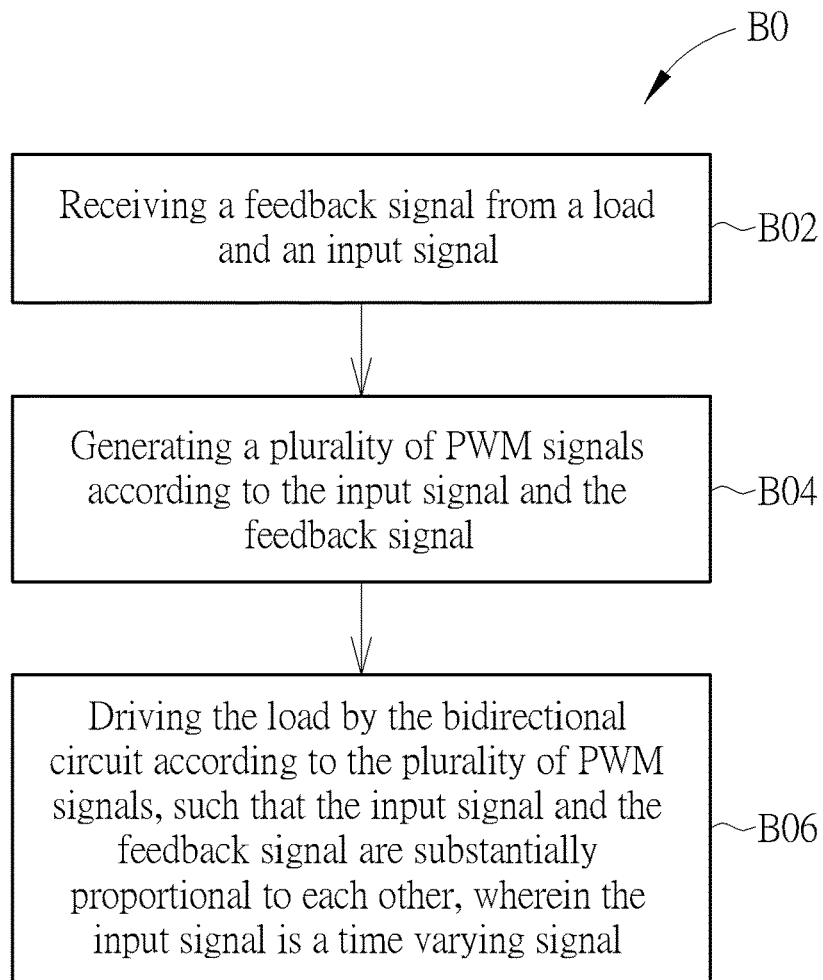
FIGS. 11-12 are flowcharts of processes according to embodiments of the present invention respectively.

In summary, operations of the driving circuit of the present application may be summarized in a process B0, as shown in FIG. 11. The process B0 comprises the following steps.

Step B02: Receiving a feedback signal from a load and an input signal.

Step B04: Generating a plurality of PWM signals according to the input signal and the feedback signal.

Step B06: Driving the load by the bidirectional circuit according to the plurality of PWM signals, such that the input signal and the feedback signal are substantially proportional to each other, wherein the input signal is a time varying signal.

Details of Step B02 may be expressed as a process C0, shown in FIG. 12. The process C0 comprises the following steps.

Step C02: Determining a difference according to the input signal and the feedback signal.

Step C04: Generating the PWM signal with a pulse width, wherein the pulse width is determined according to the difference.

The pulse width may be obtained by fetching the look-up table stored in memory, as discussed in the above, but not limited thereto. The pulse width may be obtained via on-line calculation, SPICE simulation, calibration, or physical measurement, which is also within the scope of the present application.

Details of the processes B0 and C0 may be referred to paragraphs in the above, which is not narrated herein for brevity.

To sum up, the present application determines each switching cycle to be a charging cycle or a discharging cycle, or idle according to a difference between an input signal and a feedback signal in digital domain, and determines a charging pulse in a charging cycle or a discharging pulse in a discharging cycle according to a precalculated charging/discharging PWCC look-up table. Besides, the present application a circuit configuration of the DAC 205 to finely control the pulse width $T_{SW}$ for voltage change $\Delta V$ close to 0 for charging or for voltage change $\Delta V$ close to maximum for discharging.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method, applied in a driving circuit comprising a bidirectional circuit coupled between a voltage source and a load, the method comprising:
   receiving a feedback signal from the load and an input signal;
   generating a plurality of pulse width modulation (PWM) signals according to the input signal and the feedback signal;
   driving the load by the bidirectional circuit according to the plurality of PWM signals, such that the input signal and the feedback signal are substantially proportional to each other, wherein the input signal is a time varying signal;
   wherein the step of generating a PWM signal among the plurality of PWM signals according to the input signal and the feedback signal comprises:
      determining a difference according to the input signal and the feedback signal; and
      generating the PWM signal with a pulse width, wherein the pulse width is determined according to the difference.

2. The method of claim 1, wherein the step of generating the PWM signal with the pulse width comprises:
   fetching an entry from a look-up table; and
   generating the PWM signal with the pulse width, wherein the pulse width is determined according to the entry;
   wherein the look-up table is stored in a memory.

3. The method of claim 2, wherein the step of fetching the entry from the look-up table comprises:
   obtaining a first address according to the input signal;
   fetching the entry from the memory according to the first address.

4. The method of claim 3, wherein the step of fetching the entry from the look-up table comprises
   performing an up-sampling operation on the input signal, in order to obtain an up-sampled input signal; and
   obtaining the first address according to the up-sampled input signal.

5. The method of claim 3, wherein the step of fetching the entry from the look-up table comprises:
   determining a step-size number according to the difference;
   obtaining a second address according to the step-size number; and
   fetching the entry from the memory according to the first address and the second address;
   wherein the bidirectional circuit drives the load to have a voltage change within a switching cycle, and the voltage change is proportional to the step-size number;
   wherein the entry represents a pulse width control code corresponding to the pulse width for generating the voltage change.

6. The method of claim 3, wherein the step of generating the PWM signal with the pulse width comprises:
   determining a step-size number according to the difference; and
   fetching at least an entry from the memory according to the first address;
   computing a pulse width control code according to the at least an entry and the step-size number; and
   generating the PWM signal with the pulse width corresponding to the pulse width control code;
   wherein the bidirectional circuit drives the load to have a voltage change within a switching cycle, and the voltage change is proportional to the step-size number.

7. The method of claim 1, wherein the step of generating the PWM signal with the pulse width comprises:
   obtaining a pulse width control code corresponding to the pulse width according to the difference;
   producing a voltage level according to the pulse width control code;
   producing a sawtooth-like reference waveform; and
   comparing the sawtooth-like reference waveform with the voltage level, so as to produce the PWM signal having the pulse width corresponding to the pulse width control code.

8. The method of claim 1, comprising:
   generating a first PWM signal for the bidirectional circuit to perform a charging operation according to the input signal and the feedback signal; and
   generating a second PWM signal for the bidirectional circuit to perform a discharging operation according to the input signal and the feedback signal;
   wherein during a first switching cycle of the charging operation, the bidirectional circuit forms a first current from the load to the voltage source;

wherein during a second switching cycle of the discharging operation, the bidirectional circuit forms a second current from the voltage source to the load according to the second PWM signal;

wherein the step of generating the first PWM signal and the second PWM signal comprises:
  fetching a first entry from a first look-up table;
  fetching a second entry from a second look-up table;
  generating the first PWM signal with a first pulse width, and the first pulse width is determined according to the first entry; and
  generating the second PWM signal with a second pulse width, and the second pulse width is determined according to the second entry;
  wherein the first look-up table and the second look-up table are stored in a memory.

9. The method of claim 1, wherein the step of determining the difference according to the feedback signal comprising:
  performing an analog-to-digital conversion, by an analog-to-digital converter (ADC), on the feedback signal, in order to obtain a digital feedback signal; and
  calculating the difference according to the digital feedback signal.

10. The method of claim 9, wherein the step of performing the analog-to-digital conversion by the ADC on the feedback signal comprises:
  adjusting a dynamic range of the ADC according to the input signal, a volume setting, or a pre-scanning music file.

11. The method of claim 1, comprising:
  determining whether the bidirectional circuit performs a charging operation or performs a discharging operation according to the difference.

12. The method of claim 1, wherein a voltage change produced by the driving circuit on the load within a switching cycle is a unit voltage change times a step-size number, the step-size number is determined according to the difference, and the pulse width of the PWM signal is determined according to the step-size number.

13. A driving circuit, comprising:
  a bidirectional circuit, coupled between a voltage source and a load and configured to drive the load according to a plurality of pulse width modulation (PWM) signals, such that the input signal and the feedback signal are substantially proportional to each other, wherein the input signal and the feedback signal are time varying signals;
  a PWM controller, coupled to the load and the bidirectional circuit, configured to receive a feedback signal from the load and an input signal and generate the plurality of PWM signals according to the input signal and the feedback signal;
  wherein the PWM controller determines a difference according to the input signal and the feedback signal, generates a PWM signal among the plurality of PWM signals with a pulse width, and the pulse width is determined according to the difference.

14. The driving circuit of claim 13, wherein the PWM controller comprises:
  a memory, configured to store a look-up table;
  wherein the PWM controller fetches an entry from the look-up table stored in the memory; and
  wherein the PWM controller generates the PWM signal with the pulse width, and the pulse width is determined according to the entry.

15. The driving circuit of claim 14, wherein
  the PWM controller obtains a first address which is generated according to the input signal;
  the PWM controller fetches the entry from the memory according to the first address.

16. The driving circuit of claim 15, wherein the PWM controller comprises
  an up-sampler, configured to perform an up-sampling operation on the input signal, in order to obtain an up-sampled input signal; and
  wherein the PWM controller obtains the first address according to the up-sampled input signal.

17. The driving circuit of claim 15, wherein
  the PWM controller determines a step-size number according to the difference;
  the PWM controller obtains a second address according to the step-size number; and
  the PWM controller fetches the entry from the memory according to the first address and the second address;
  the bidirectional circuit drives the load to have a voltage change within a switching cycle, and the voltage change is proportional to the step-size number;
  the entry represents a pulse width control code corresponding to the pulse width.

18. The driving circuit of claim 15, wherein:
  the PWM controller determines a step-size number according to the difference; and
  the PWM controller fetches at least an entry from the memory according to the first address;
  the PWM controller computes a pulse width control code according to the at least an entry and the step-size number; and
  the PWM controller generates the PWM signal with the pulse width corresponding to the pulse width control code;
  the bidirectional circuit drives the load to have a voltage change within a switching cycle, and the voltage change is proportional to the step-size number.

19. The driving circuit of claim 13, wherein the PWM controller comprises:
  a digital-to-analog converter (DAC), configured to convert a pulse width control code, obtained by the PWM controller, into an analog voltage;
  a waveform generator, configured to generate a sawtooth-like reference waveform; and
  a comparator, configured to compare the sawtooth-like reference waveform with the voltage level, and produce a comparison result as the PWM signal having the pulse width corresponding to the pulse width control code.

20. The driving circuit of claim 19, wherein the DAC comprises:
  a plurality of reference modules, comprising a plurality of reference capacitors and a plurality of reference switches, wherein the plurality of reference modules are mutually connected in parallel, and each reference module comprises a reference capacitor and a reference switch connected in series;
  an output capacitor, configured to output the analog voltage; and
  a sharing switch, coupled between the output capacitor and the plurality of reference modules;
  wherein a plurality of reference capacitances of the plurality of reference capacitors are identical;

wherein the plurality of reference switches are controlled by a plurality of control signals, and the plurality of control signals are corresponding to the pulse width control code;

wherein the DAC produces an analog voltage according to the control code;

wherein an analog difference, between a first analog voltage corresponding to a first control code and a second analog voltage corresponding to a second control code, monotonically increases or monotonically decreases as a first value corresponding to the first control code increases;

wherein the first control code is consecutive to the second control code.

21. The driving circuit of claim 20, wherein the analog difference corresponding to the first control code monotonically increases or monotonically decreases as a first number increases;

the first number represents a number of the reference switches begin conducted during a first phase corresponding to the first control code;

the sharing switch is conducted during the first phase.

22. The driving circuit of claim 20, comprising:

a pre-charging switch, coupled to the plurality of reference modules; and a discharging switch, coupled between two terminals of the output capacitor;

wherein during a first phase in which the sharing switch is conducted, the pre-charging switch and the discharging switch are cutoff;

wherein during a second phase in which the sharing switch is cutoff, the pre-charging switch and the discharging switch are conducted.

23. The driving circuit of claim 22, wherein during the first phase, a first number of the reference switches are conducted and a second number of the reference switches are cutoff;

during the second phase, the reference switches are conducted.

24. The driving circuit of claim 22, wherein a terminal of the pre-charging switch receives a reference voltage.

25. The driving circuit of claim 13, wherein the PWM controller comprises:

a memory, configured to store a first look-up table and a second look-up table;

wherein the PWM controller fetches a first entry from the first look-up table stored in the memory; and wherein the PWM controller fetches a second entry from the second look-up table stored in the memory;

wherein the PWM controller generates a first PWM signal with a first pulse width, and the first pulse width is determined according to the first entry for a charging operation;

wherein the PWM controller generates the second PWM signal with a second pulse width, and the second pulse width is determined according to the second entry for a discharging operation.

26. The driving circuit of claim 13, wherein the PWM controller comprises:

an analog-to-digital converter (ADC), configured to perform an analog-to-digital conversion on the feedback signal, in order to obtain a digital feedback signal; and wherein the PWM controller calculates the difference according to the digital feedback signal.

27. The driving circuit of claim 13, wherein the PWM controller determines whether the bidirectional circuit performs a charging operation or performs a discharging operation according to the difference.

28. The driving circuit of claim 13, wherein a target voltage change produced by the driving circuit on the load within a switching cycle is a unit voltage change times a step-size number, the step-size number is determined according to the difference, and the pulse width of the PWM signal is determined according to the step-size number.

29. The driving circuit of claim 13, wherein the bidirectional circuit comprises:

a charging circuit, configured to form a first current from the voltage source to the load according to a first PWM signal; and a discharging circuit, configured to form a second current from the load back to the voltage source according to a second PWM signal.

30. The driving circuit of claim 13, wherein the bidirectional circuit comprises:

a first switch, comprising a first terminal coupled to the voltage source, and a second terminal;

a second switch, comprising a first terminal coupled to the second terminal of the first switch, and a second terminal;

an inductor, comprising a first terminal coupled to the second terminal of the first switch and the first terminal of the second switch, and a second terminal;

a third switch, comprising a first terminal coupled to the second terminal of the inductor, and a second terminal coupled to a first terminal of the capacitive load; and a fourth switch, comprising a first terminal coupled to the second terminal of the inductor and the first terminal of the third switch, and a second terminal;

wherein the first switch, the second switch, the third switch and the fourth switch are controlled by the plurality of PWM signals generated by the PWM controller according to the input signal and the output signal.

* * * * *